(12) United States Patent
Kim et al.

(10) Patent No.: US 11,502,663 B2
(45) Date of Patent: Nov. 15, 2022

(54) ACOUSTIC RESONATOR

(71) Applicant: Samsung Electro-Mechanics., Co., Ltd., Suwon-si (KR)

(72) Inventors: Tae Yoon Kim, Suwon-si (KR); Jong Woon Kim, Suwon-si (KR); Dae Hun Jeong, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 802 days.

(21) Appl. No.: 16/441,599

(22) Filed: Jun. 14, 2019

(65) Prior Publication Data
US 2020/0204148 A1 Jun. 25, 2020

(30) Foreign Application Priority Data

Dec. 19, 2018 (KR) .................. 10-2018-0165540
Mar. 19, 2019 (KR) .................. 10-2019-0030936

(51) Int. Cl.
*H03H 9/02* (2006.01)
*H03H 3/04* (2006.01)
*H03H 9/17* (2006.01)
*H03H 3/02* (2006.01)

(52) U.S. Cl.
CPC .......... *H03H 9/02102* (2013.01); *H03H 3/04* (2013.01); *H03H 9/02118* (2013.01); *H03H 9/174* (2013.01); *H03H 2003/023* (2013.01); *H03H 2003/0407* (2013.01)

(58) Field of Classification Search
CPC . H03H 9/02102; H03H 9/02118; H03H 9/174
See application file for complete search history.

(56) References Cited

U.S. PATENT DOCUMENTS

| | | |
|---|---|---|
| 9,136,818 B2 | 9/2015 | Burak et al. |
| 9,444,428 B2 | 9/2016 | Ruby et al. |
| 2008/0024041 A1 | 1/2008 | Shibata |
| 2009/0127978 A1 | 5/2009 | Asai et al. |
| 2014/0232244 A1* | 8/2014 | Sridaran .............. H03H 9/08 310/343 |

(Continued)

FOREIGN PATENT DOCUMENTS

| | | |
|---|---|---|
| JP | 2009-124640 A | 6/2009 |
| KR | 10-2018-0101129 A | 9/2018 |

OTHER PUBLICATIONS

Korean Office Action dated May 29, 2020 in the corresponding Korean Patent Application No. 10-2019-0030936 (3 pages in English, 3 pages in Korean).

(Continued)

*Primary Examiner* — Bryan P Gordon
(74) *Attorney, Agent, or Firm* — NSIP Law

(57) ABSTRACT

An acoustic resonator includes: a resonating unit including a piezoelectric layer, a first electrode disposed on a lower side of the piezoelectric layer, and a second electrode disposed on an upper side of the piezoelectric layer; a substrate disposed below the resonating unit; a support unit forming a cavity between the substrate and the resonating unit; and a pillar extending through the cavity and connecting the resonating unit to the substrate. The resonating unit further includes a first insertion layer disposed above the pillar.

19 Claims, 30 Drawing Sheets

(56) References Cited

U.S. PATENT DOCUMENTS

2017/0244021 A1* 8/2017 Han .................... H01L 41/0475
2018/0219528 A1* 8/2018 Liu ....................... H03H 9/131
2018/0254764 A1* 9/2018 Lee ....................... H03H 9/174
2018/0309428 A1* 10/2018 Lim ...................... H03H 9/173

OTHER PUBLICATIONS

Korean Office Action dated Nov. 19, 2020 in counterpart Korean Patent Application No. 10-2019-0110201 (7 pages in English, 5 pages in Korean).
Non-Final Office Action issued on Aug. 4, 2022, in related U.S. Appl. No. 16/692,142 (8 Pages).

* cited by examiner

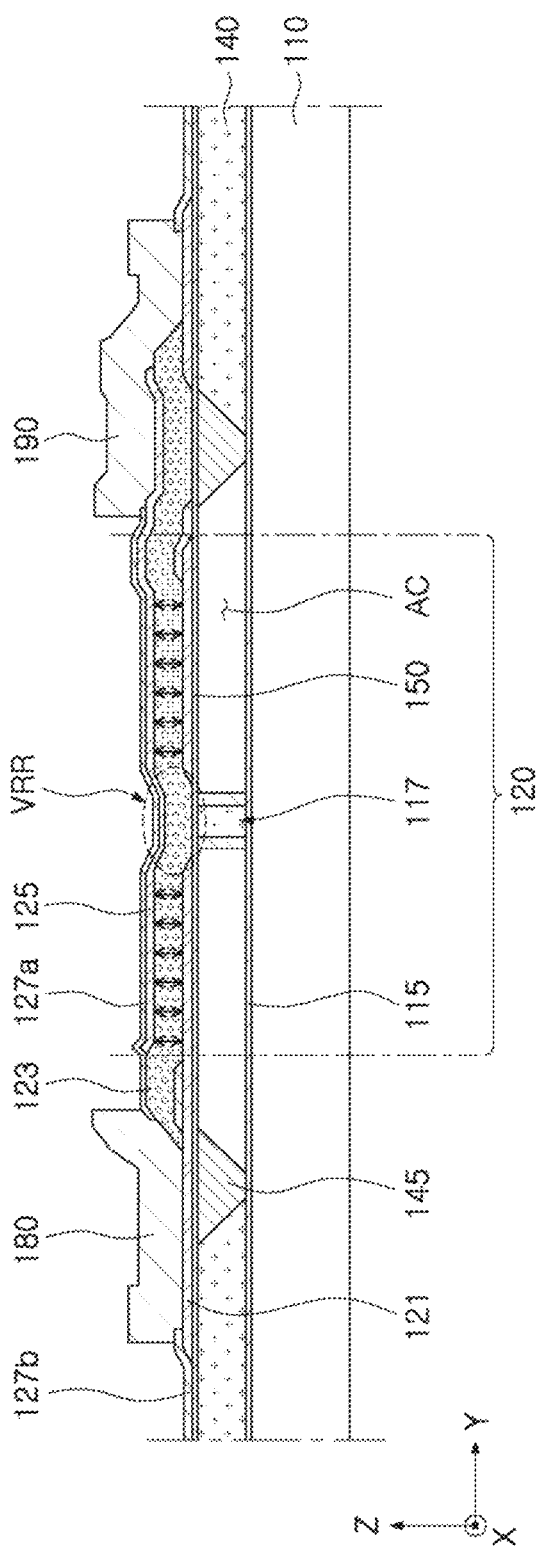

ACOUSTIC RESONATOR

CROSS-REFERENCE TO RELATED APPLICATIONS

This application claims the benefit under 35 U.S.C. § 119(a) of Korean Patent Application Nos. 10-2018-0165540 and 10-2019-0030936 filed on Dec. 19, 2018 and Mar. 19, 2019, respectively, in the Korean Intellectual Property Office, the entire disclosures of which are incorporated herein by reference for all purposes.

BACKGROUND

1. Field

The following disclosure relates to an acoustic resonator.

2. Description of Related Art

With the recent rapid development of mobile communication devices, chemical and biological devices, and the like, a demand for a small and lightweight filter, an oscillator, a resonant element, an acoustic resonant mass sensor, and the like, used in such devices, is increasing. The acoustic resonator may be configured as a means for implementing such a small and lightweight filter, an oscillator, a resonant element, an acoustic resonant mass sensor, and the like, and may be implemented as a thin bulk acoustic resonator (FBAR).

FBARs may be mass-produced at a minimal cost, and may be implemented to have a subminiature size. In addition, the FBAR may implement a high quality factor (QF) value, which is a main characteristic of a filter, and may be used even in a microwave frequency band. Particularly, the FBAR may implement bands of a personal communication system (PCS) and a digital cordless system (DCS).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes: a resonating unit including a piezoelectric layer, a first electrode disposed on a lower side of the piezoelectric layer, and a second electrode disposed on an upper side of the piezoelectric layer; a substrate disposed below the resonating unit; a support unit forming a cavity between the substrate and the resonating unit; and a pillar extending through the cavity and connecting the resonating unit to the substrate. The resonating unit further includes a first insertion layer disposed above the pillar.

The acoustic resonator may further include a first etch stop layer disposed between the support unit and the cavity.

The pillar may include: a second etch stop layer disposed in the cavity and disposed between the resonating unit and the substrate; and a thermally conductive layer surrounded by the second etch stop layer and formed of a material different from a material of the second etch stop layer.

A hole may be located above the pillar and may be disposed in either one or both of the first electrode and the second electrode.

The acoustic resonator may further include: a frame disposed on an upper side of the first electrode or an upper side of the second electrode, and disposed to surround the hole; and a second insertion layer disposed further outwardly from the pillar in a horizontal direction than the first insertion layer.

The first insertion layer may be disposed to cover the hole.

The acoustic resonator may further include a frame disposed on an upper side of the first electrode or an upper side of the second electrode, and surrounding at least a portion of the resonating unit.

The resonating unit may further include a second insertion layer disposed further outwardly from the pillar in the horizontal direction than the first insertion layer.

The first insertion layer may include a metal insertion layer.

The first insertion layer may further include an insulating insertion layer disposed between the first electrode and the piezoelectric layer. The metal insertion layer may be disposed between the first electrode and the pillar.

The resonating unit may further include: a second insertion layer disposed further outwardly from the pillar in the horizontal direction than the first insertion layer, the second insertion layer including a metal and being electrically connected to the first or second electrode; and a metal layer electrically connected to the second insertion layer, the metal layer being disposed on the upper side of the first or second electrode, and being formed of a material different from a material of the first or second electrode.

A width of an upper surface of the pillar may be less than a width of the first insertion layer, and a width of a lower surface of the pillar may be greater than the width of the first insertion layer.

The acoustic resonator may further include: a membrane layer disposed between the resonating unit and the pillar; and an insulating layer disposed between the pillar and the substrate.

In another general aspect, an acoustic resonator includes: a resonating unit including a piezoelectric layer, a first electrode disposed on a lower side of the piezoelectric layer, and a second electrode disposed on an upper side of the piezoelectric layer; a substrate disposed below the resonating unit; a support unit forming a cavity between the substrate and the resonating unit; a first etch stop layer disposed between the support unit and the cavity; and a pillar including a second etch stop layer disposed in the cavity and disposed between the resonating unit and the substrate, and a thermally conductive layer surrounded by the second etch stop layer and formed of a material different from a material of the second etch stop layer. A hole is located above the pillar and is disposed in either one or both of the first electrode and the second electrode.

The thermally conductive layer may have a thermal conductivity higher than a thermal conductivity of the second etch stop layer.

A width of a lower surface of the pillar may be larger than a width of an upper surface of the pillar.

The acoustic resonator may further include a first frame disposed on an upper side of the first electrode or an upper side of the second electrode, and disposed to surround the hole.

The acoustic resonator may further include an insertion layer disposed outside of the resonating unit in a horizontal direction.

The insertion layer may be disposed between the first electrode and the piezoelectric layer.

Other features and aspects will be apparent from the following detailed description, the drawings, and the claims.

BRIEF DESCRIPTION OF DRAWINGS

FIGS. 2A to 2C are side views illustrating an acoustic resonator, according to an embodiment, having a structure in which an insertion layer corresponding to a hole is omitted, in comparison to the acoustic resonator illustrated in FIGS. 1A to 1D.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
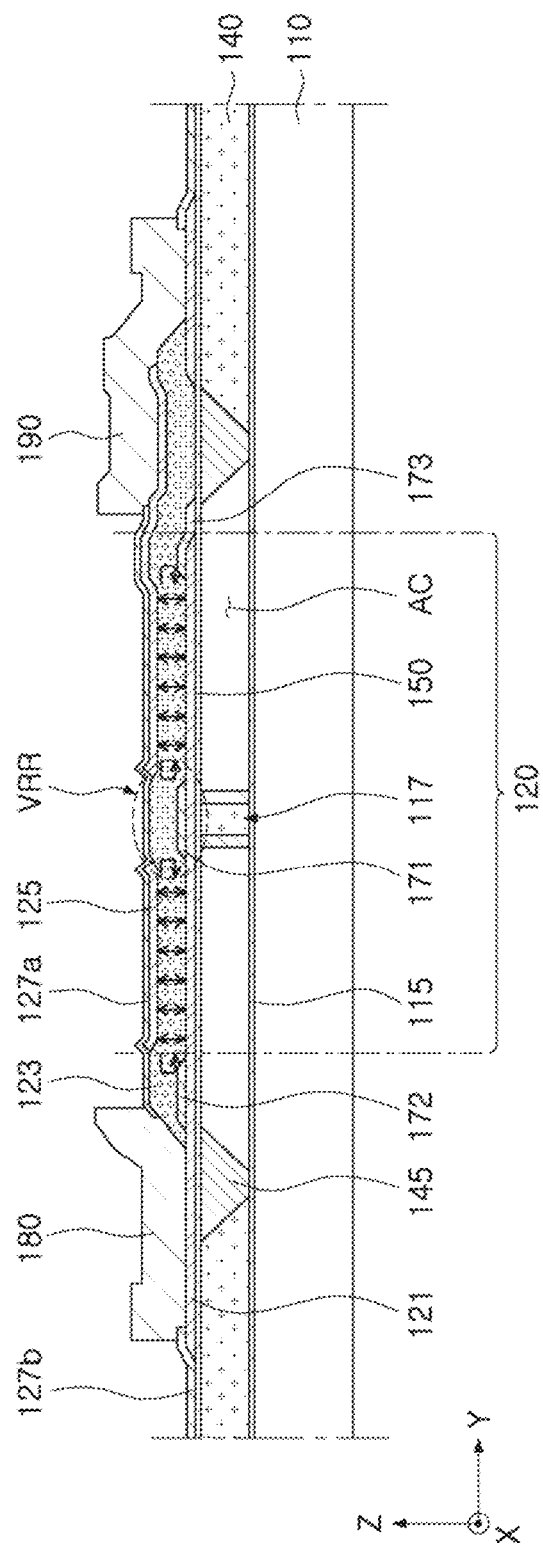
FIGS. 1A to 1D are side views illustrating an acoustic resonator and an insertion layer included therein, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIGS. 1A to 1D are side views illustrating an acoustic resonator and an insertion layer included therein, according to embodiments.

Referring to FIGS. 1A to 1D, an acoustic resonator, according to an embodiment, may include a resonating unit 120 in which a first electrode 121, a piezoelectric layer 123, and a second electrode 125 are sequentially stacked.

The first and second electrodes 121 and 125 may induce an electric field in the piezoelectric layer 123 when receiving electrical energy. For example, the first and second electrodes 121 and 125 may be formed of gold, molybdenum, ruthenium, iridium, aluminum, platinum, titanium, tungsten, palladium, tantalum, chromium, nickel or a metal containing any one or any combination of any two or more thereof, and may include either one of a rare earth metal and a transition metal. However, the first and second electrodes 121 and 125 are not limited to the foregoing materials.

The electric field induced in the piezoelectric layer 123 by the first and second electrodes 121 and 125 may induce a piezoelectric phenomenon in the piezoelectric layer 123 to cause vibrations in a predetermined direction of the resonating unit 120. Accordingly, the resonating unit 120 may generate resonance while generating bulk acoustic waves in a direction corresponding to a vibration direction (for example, a vertical direction).

For example, zinc oxide (ZnO), aluminum nitride (AlN), doped aluminum nitride, lead zirconate titanate, quartz, and the like, may be selectively used as a material of the piezoelectric layer 123. The doped aluminum nitride may further include a rare earth metal, a transition metal, or an alkaline earth metal. As an example, the rare earth metal may include any one or any combination of any two or more of scandium (Sc), erbium (Er), yttrium (Y), and lanthanum (La), and the rare earth metal content may be 1 to 20 at %. The transition metal may include any one or any combination of any two or more of hafnium (Hf), titanium (Ti), zirconium (Zr), tantalum (Ta), and niobium (Nb). In addition, the alkaline earth metal may include magnesium (Mg).

By the resonance, the resonating unit 120 may pass or cut off a signal in a specific frequency band applied to the first and/or second electrodes 121 and 125 and may cut off or pass energy other than in the specific frequency band. An acoustic resonator may have a sharp skirt characteristic at a boundary of the specific frequency band, and thus may be used for a high frequency circuit (for example, a filter, an oscillator, or the like) in a microwave frequency band (for example, several hundreds of MHz to several tens of GHz), such that the performance of the high frequency circuit may be improved or the size of the high frequency circuit may be reduced.

In addition, the acoustic resonator may include a cavity AC disposed on a lower side of the resonating unit 120 to prevent acoustic waves from leaking to the substrate 110. That is, the cavity AC may separate the substrate 110 and the resonating unit 120 from each other, thereby preventing the acoustic waves from leaking to the substrate 110.

Accordingly, the acoustic resonator may have a further improved quality factor QF. For example, the cavity AC may include at least one reflective layer to more effectively prevent substrate leakage of the acoustic waves.

In addition, because the cavity AC is provided inside a support unit 140, the resonating unit 120, which is supported by the support unit 140, may be formed to be generally flat. An etch stop layer 145 may be disposed along a boundary of the cavity AC such that the side of the cavity AC is determined in the process of forming the cavity AC.

The resonating unit 120 may generate heat due to the applied electric field and vibration. Almost all of the generated heat may be radiated in a horizontal direction due to the cavity AC. The heat radiated in the horizontal direction may radiate to the substrate 110 through the support unit 140 and/or the etch stop layer 145. That is, the heat generated in the resonating unit 120 may be diverted and radiated.

The acoustic resonator may provide an additional radiation path of the heat generated in the resonating unit 120 by including a pillar 117.

Accordingly, the acoustic resonator may improve heat generation efficiency while having an improved quality factor based on the cavity AC, and thus may have improved robustness in comparison to conventional acoustic resonators.

However, the pillar 117 may form a path through which vibrations of the resonating unit 120 leak to the substrate 110. The vibration leakage of the resonating unit 120 may cause deterioration of the quality factor.

A portion of the resonating unit 120 which overlaps with the pillar 117 vertically may include a hole VRR in the first and second electrodes 121 and 125, but the hole VRR may be omitted according to design parameters.

The resonating unit 120 may further include a first insertion layer 171 disposed on the portion of the resonating unit 120 vertically overlapping with the pillar 117.

The first insertion layer 171 may reflect vibration toward the pillar 117 in the piezoelectric layer 123. Accordingly, leaking of the vibration of the resonating unit 120 through the pillar 117 may be reduced.

For example, the first insertion layer 171 may be formed of a dielectric such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from the piezoelectric layer 123. In addition, the first insertion layer 171 may be formed of a conductive material such as aluminum (Al), titanium (Ti), or the like, but may be formed of a material different from that of the first and second electrodes 121 and 125. In addition, if necessary, it is also possible to form a region in which the first insertion layer 171 is replaced by an air space. This configuration may be realized by forming all of the resonating unit 120 in the manufacturing process, and then removing the first insertion layer 171.

In addition, the thickness of the first insertion layer 171 may be the same as, similar to, or thinner than, that of the piezoelectric layer 123. When the thickness of the first insertion layer 171 is thinner than the thickness of the piezoelectric layer 123, an inclined portion of the piezoelectric layer 123 may be formed due to the first insertion layer 171 and a crack or the like may not occur, thereby contributing to the improvement of the resonator performance. There is no particular lower limit of the thickness of the first insertion layer 171, but the thickness of the first insertion layer 171 may be 100 Å or more to easily adjust the deposition thickness and ensure the uniformity of thickness in a deposited wafer.

For example, a side surface of the first insertion layer 171 may be inclined, and may be formed to have an inclination angle of 5° to 70°, but the disclosure is not limited to such an example.

Referring to FIG. 1A, the first insertion layer 171 may be disposed on an upper surface of the first electrode 121. Accordingly, the piezoelectric layer 123 may have a curvature corresponding to the first insertion layer 171.

Figure 1B:
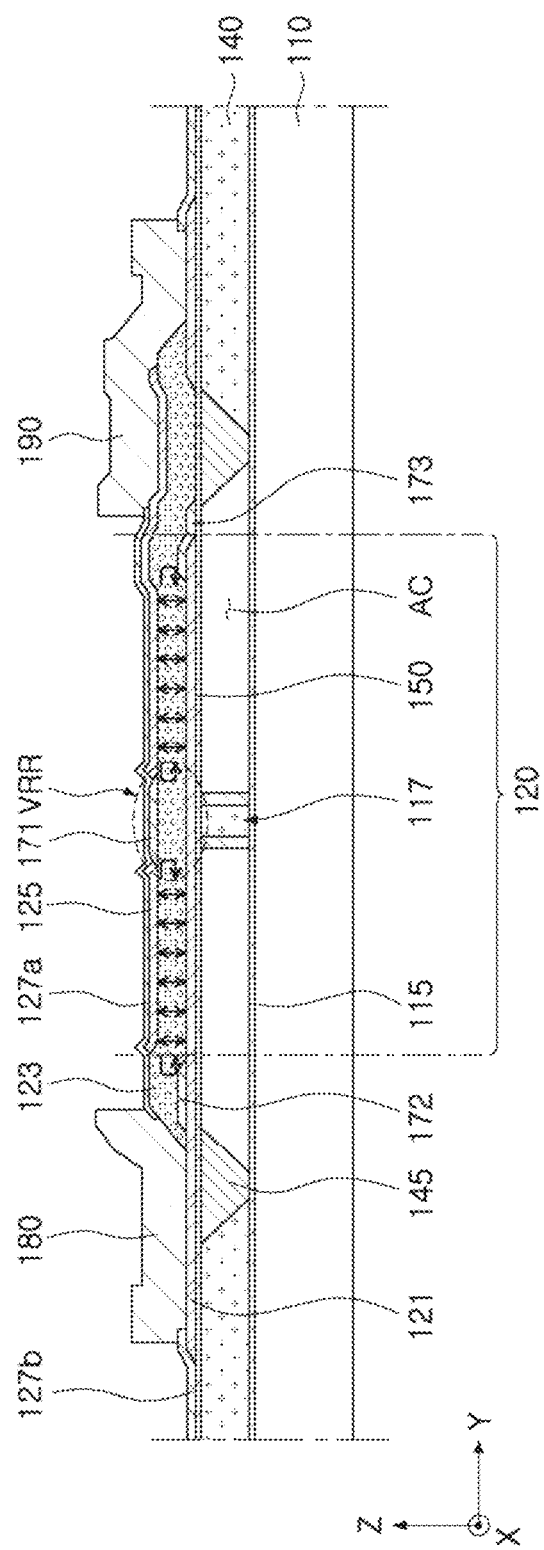
Figure 1C:
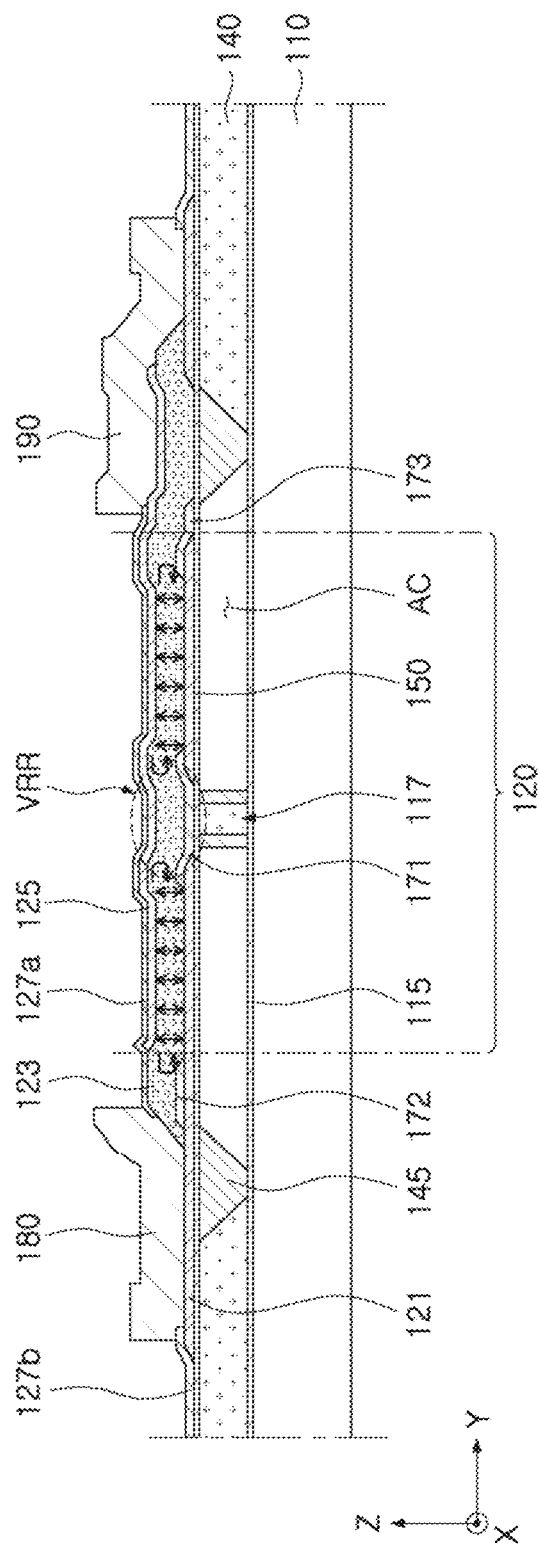

Referring to FIG. 1B, according to another example, the first insertion layer 171 may be disposed on the second electrode 125. Accordingly, the first insertion layer 171 may cover the hole VRR of the second electrode 125.

Referring to FIG. 10, according to another example, the first insertion layer 171 may be disposed to fill a space in which the first electrode 121 is removed. That is, the first insertion layer 171 may cover the hole VRR of the first electrode 121, and the vibration leakage through the pillar 117 in the resonating unit 120 may be further reduced.

Figure 1D:
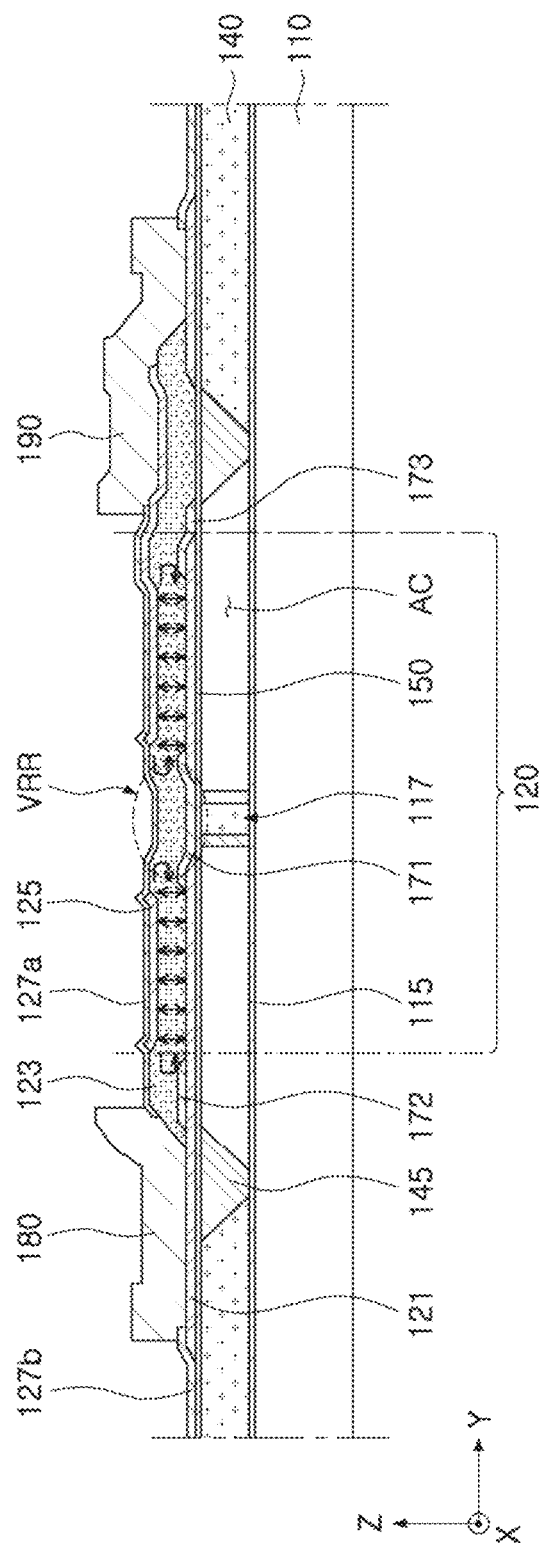

Referring to FIG. 1D, the first insertion layer 171 may be disposed on the hole VRR of the first electrode 121, and the second electrodes 121 and 125 may have the hole VRR.

In addition, referring to FIGS. 1A to 1D, the resonating unit 120 may further include second insertion layers 172 and 173 disposed outwardly from the first insertion layer 171 and the pillar 117 in the horizontal direction (for example: the x direction and/or the y direction). The second insertion layers 172 and 173 may be disposed on the first and/or second electrodes 121 and 125, and may be implemented in the same manner as the first insertion layer 171.

The second insertion layers 172 and 173 may reflect outwardly leaking vibrations among vibrations generated in the resonating unit 120, such that the quality factor of the resonating unit 120 may be further improved.

Figure 2A:
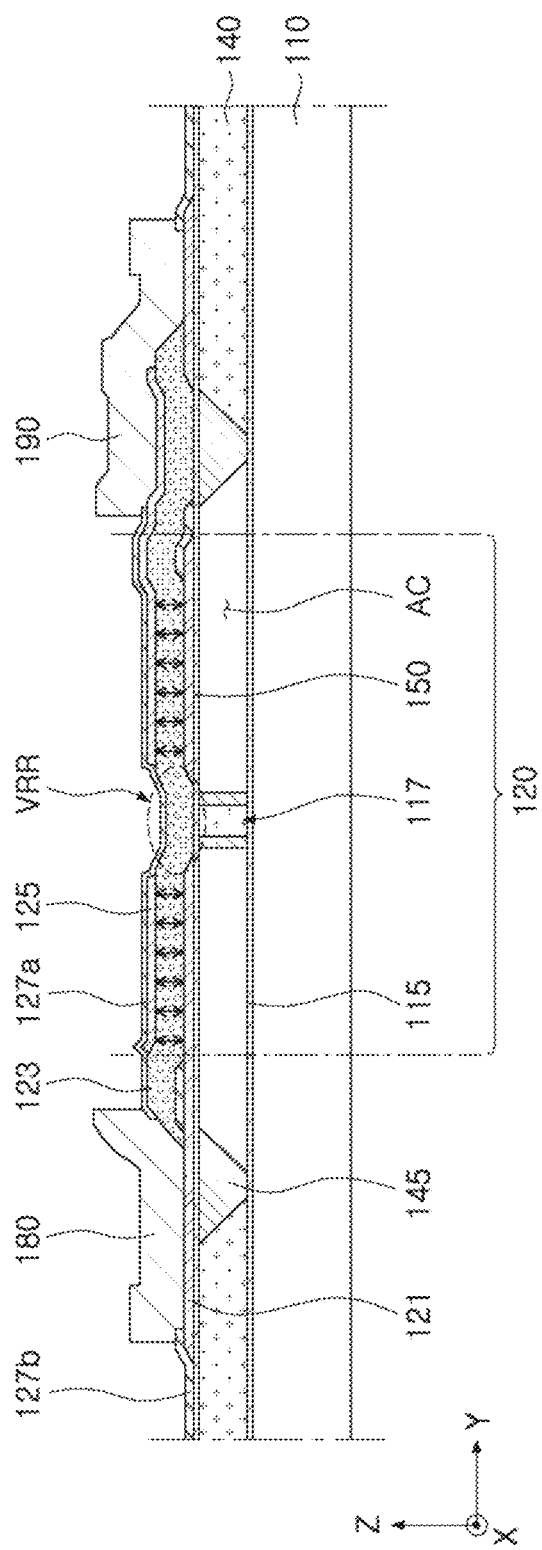
Figure 2B:
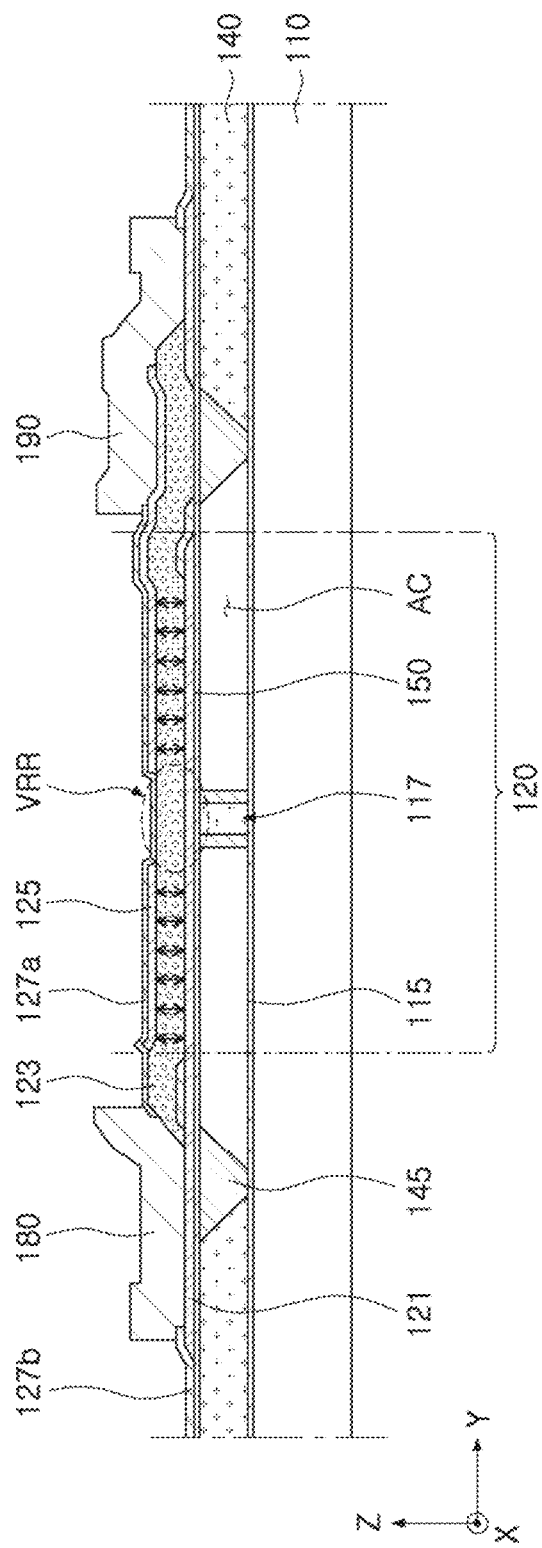

FIGS. 2A to 2C are side views illustrating an acoustic resonator, according to an embodiment, having a structure in which the insertion layer 171 corresponding to the hole VRR is omitted, in comparison to the acoustic resonator of FIGS. 1A to 1D.

Referring to FIGS. 2A to 2C, either one or both of the first and second electrodes 121 and 125 of the acoustic resonator 200 may reduce vibrations generated on the upper side of the pillar 117 by including the hole VRR.

Accordingly, the vibration of the resonating unit 120 may be more concentrated on a portion not overlapping the pillar 117 than a portion overlapping the pillar 117.

Therefore, the acoustic resonator 200 may reduce vibration leakage to the substrate 110 while ensuring an improved quality factor and heat generation efficiency due to to the inclusion of the cavity AC and the pillar 117.

FIGS. 3A to 3D are side views illustrating various structures of a pillar of an acoustic resonator, according to an embodiment.

Figure 3A:
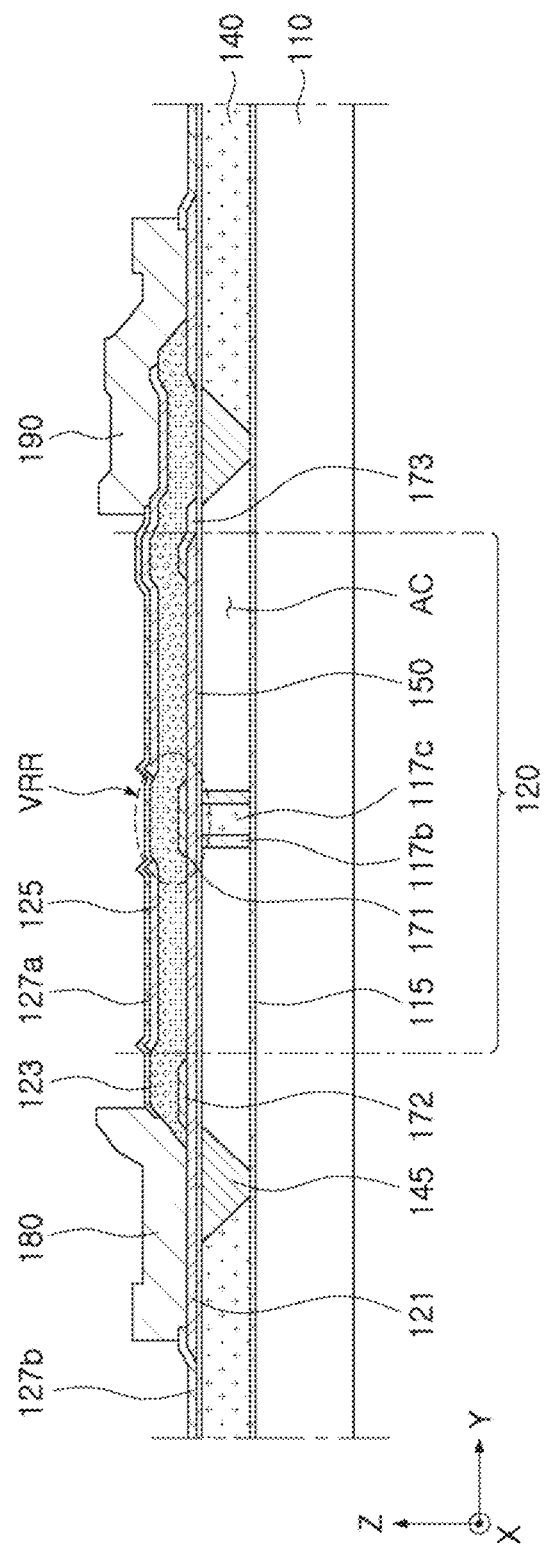
FIGS. 3A to 3D are side views illustrating various structures of pillars of an acoustic resonator, according to an embodiment.

Referring to FIG. 3A, the pillar may be disposed in the cavity AC, and may include a second etch stop layer 117*b* disposed between the resonating unit 120 and the substrate 110, and a thermally conductive layer 117*c* surrounded by the second etch stop layer 117*b*.

The second etch stop layer 117*b* may protect the thermally conductive layer 117*c* in the process of forming the cavity AC. The second etch stop layer 116*b* may be formed of the same material as the first etch stop layer 145, but is not limited to being formed of the same material as the first etch stop layer 145.

The thermally conductive layer 117*c* may be formed of the same material as the support unit 140, but is not limited to the same material as the support unit 140. For example, the thermally conductive layer 117*c* may be formed of a material having thermal conductivity higher than that of the second etch stop layer 117*b*, thereby transferring the heat generated in the resonating unit 120 to the substrate 110 more efficiently.

For example, when the support unit 140 is formed of Poly-Si, the second etch stop layer 117*b* may be made of a material having high thermal conductivity, such as an AlN series material and a rare earth doped AlN series material.

Figure 3B:
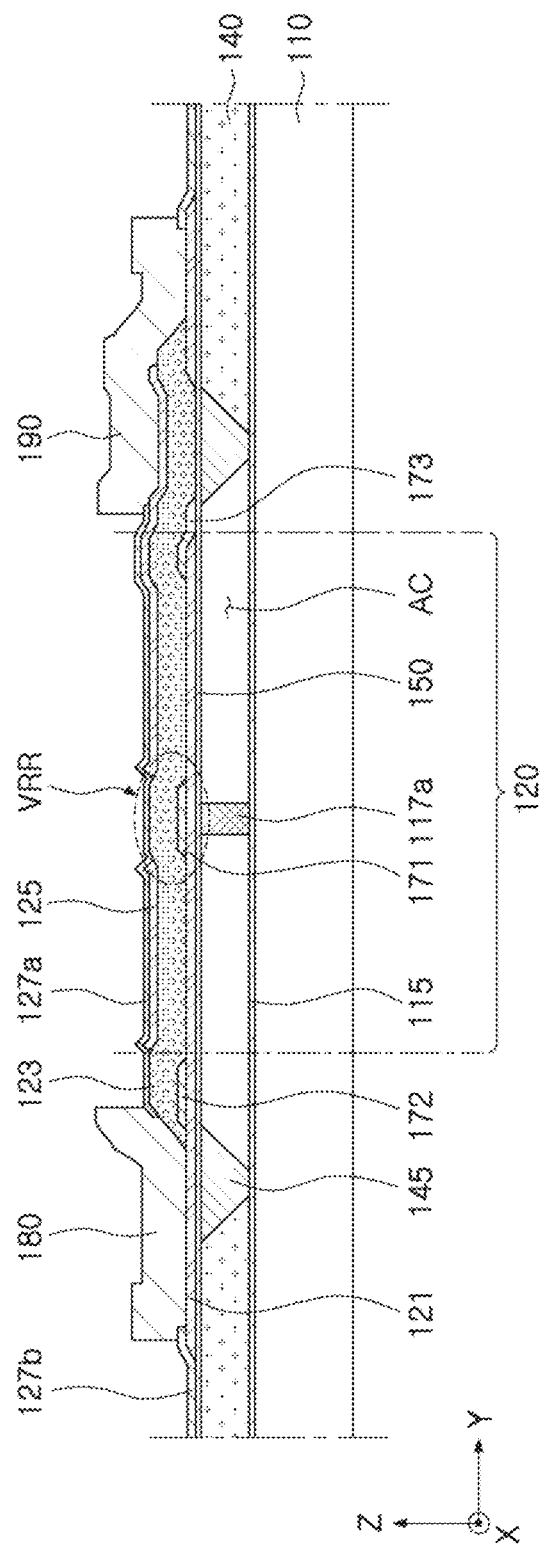

Referring to FIG. 3B, the pillar may only be formed of a metal pillar 117*a* without the second etch stop layer 117*b*. Accordingly, heat generated in the resonating unit 120 may be transmitted more efficiently to the substrate 110. For example, the metal pillar 117*a* may be made of Au or Cu.

Figure 3C:
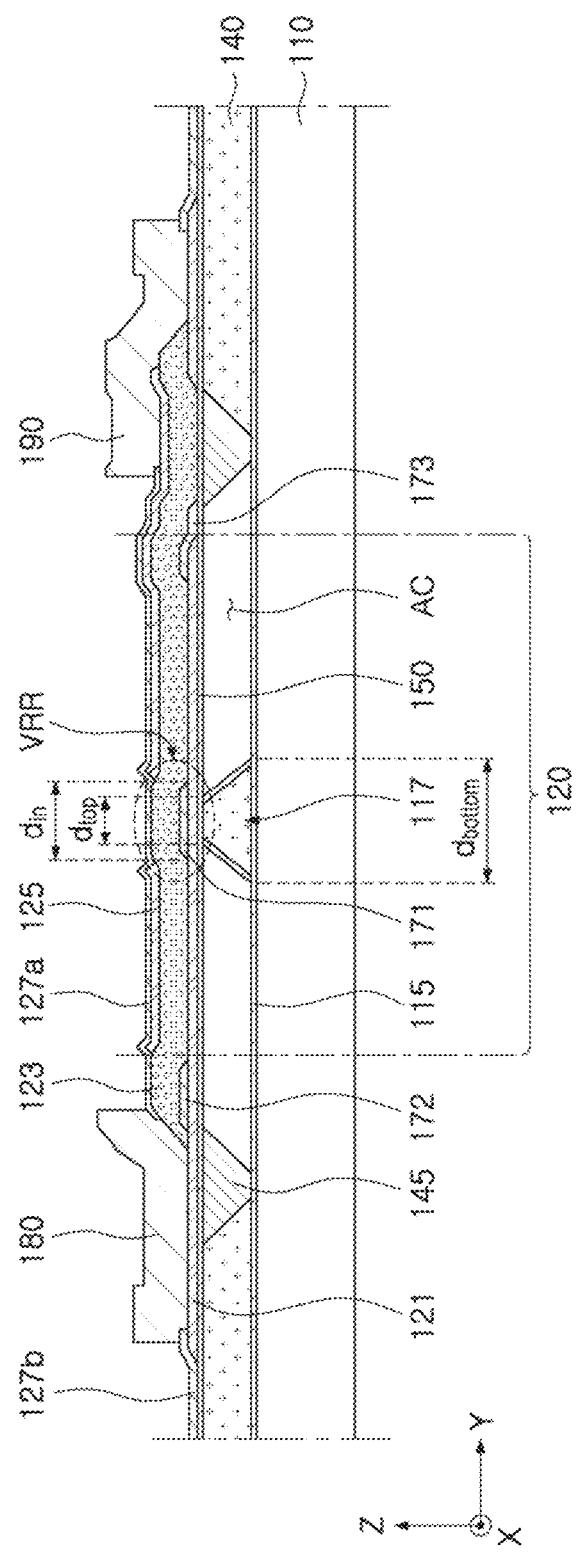
Figure 3D:
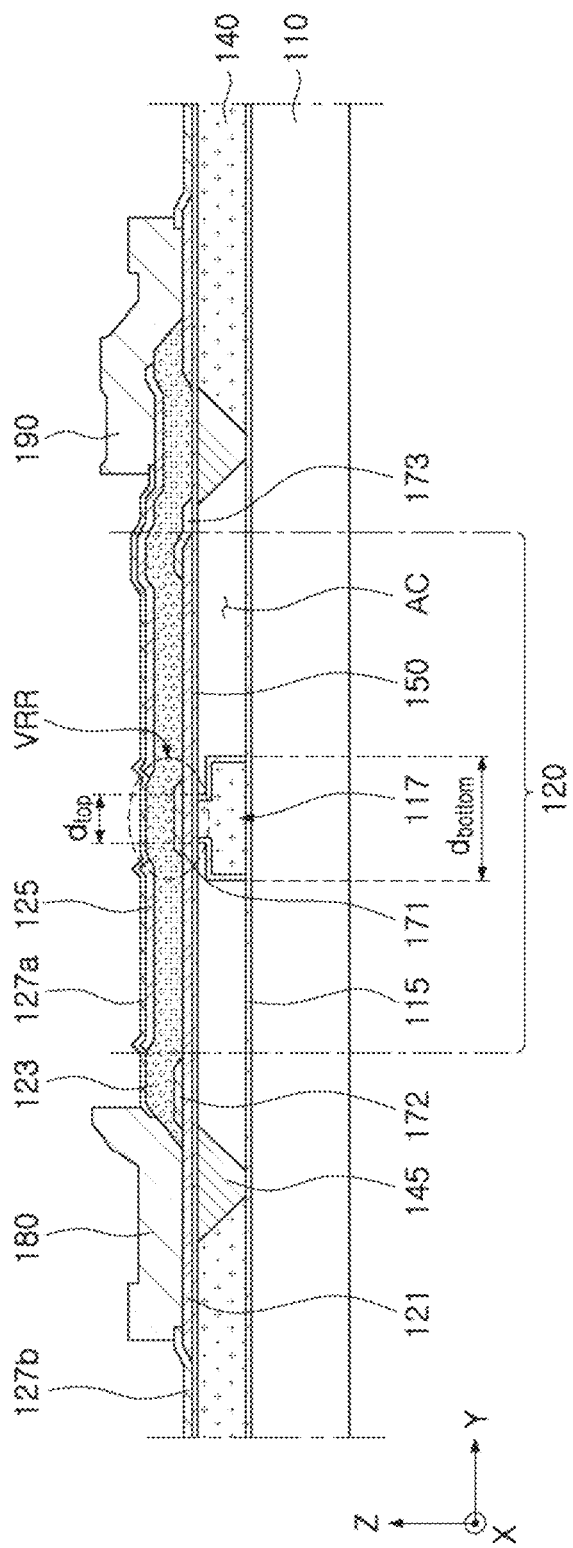

Referring to FIGS. 3C and 3D, a width $d_{bottom}$ of a lower surface of the pillar 117 may be greater than a width $d_{top}$ of an upper surface of the pillar 117.

The vibrations leaking from the resonating unit 120 to the pillar 117 may be further reduced as the width $d_{top}$ of the upper surface of the pillar 117 is narrowed. Thermal resistance of the pillar 117 may be lowered as the width $d_{bottom}$ of the lower surface of the pillar 117 is widened.

Therefore, the acoustic resonator, according to an embodiment, may further improve heat radiation performance while reducing the vibration leakage to the substrate 110.

For example, the width $d_{top}$ of the upper surface of the pillar 117 may be less than a width $d_{in}$ of the first insertion layer 171, and the width $d_{bottom}$ of the lower upper surface of the pillar 117 may be greater than the width $d_{in}$ of the first insertion layer 171.

FIGS. 4A to 4E are side views illustrating various structures of an insertion layer of an acoustic resonator, according to an embodiment.

Referring to FIGS. 4A to 4D, a first insertion layer may include a first metal insertion layer 176.

The first metal insertion layer 176 may reflect the vibration toward the pillar 117 from the resonating unit 120 while utilizing the high thermal conductivity of the resonating unit 120 to efficiently transmit heat generated in the resonating unit 120 to the pillar 117.

In addition, a second insertion layer may include second metal insertion layers 177 and 178 electrically connected to the first electrode 121 and the second electrode 125, respectively. The second metal insertion layers 177 and 178 may not only reflect outwardly leaking vibrations among vibrations generated in the resonating unit 120 but also reduce connection resistance with respect to the first and second metal layers 180 and 190 and the first and second electrodes 121 or 125, such that insertion loss of the acoustic resonator may be improved.

Figure 4A:
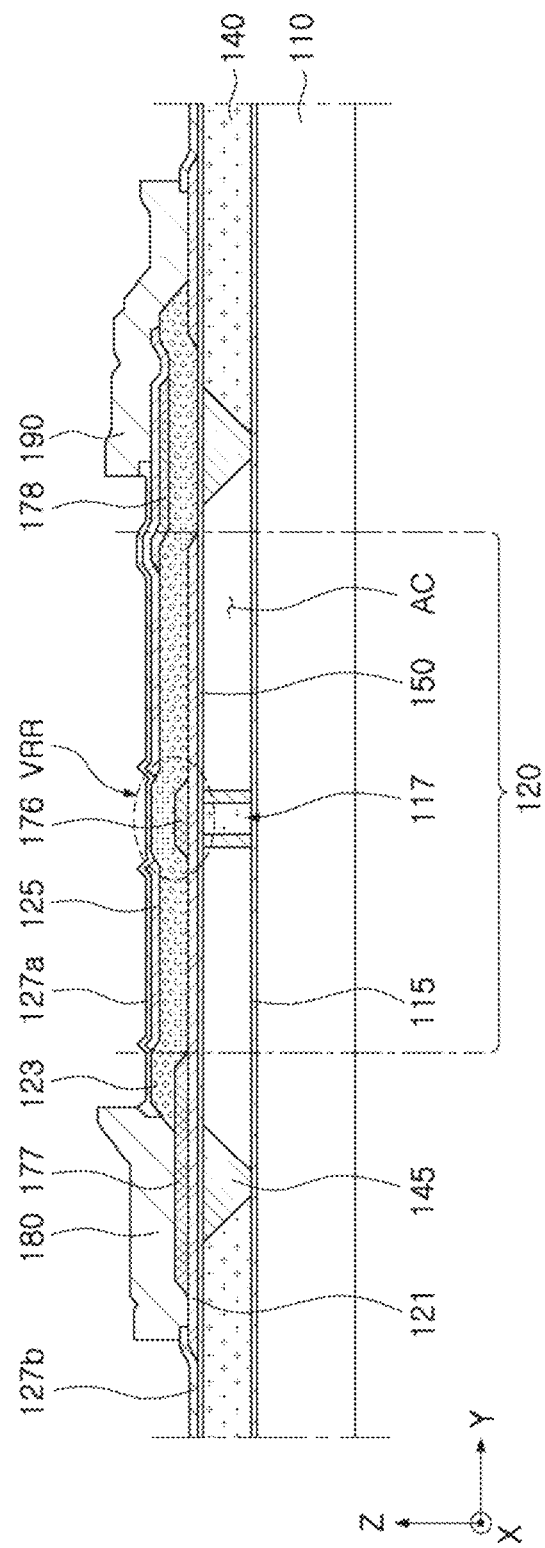
FIGS. 4A to 4E are side views illustrating various structures of insertion layers of an acoustic resonator, according to an embodiment.
Figure 4B:
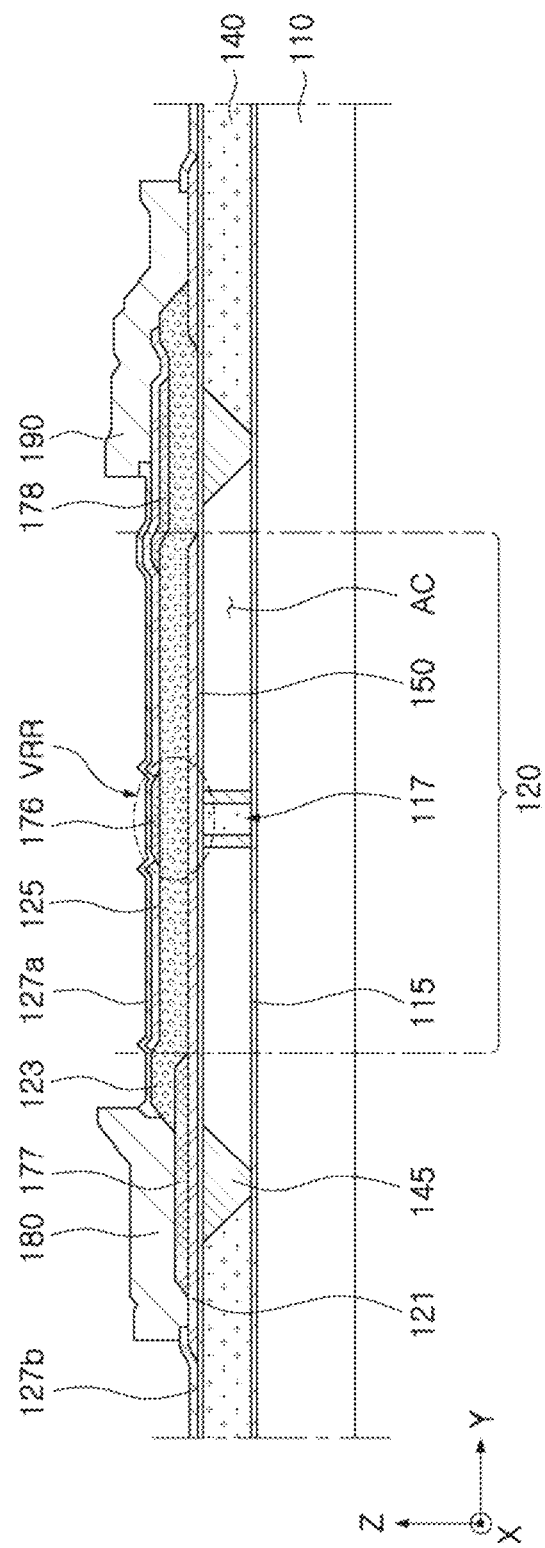
Figure 4C:
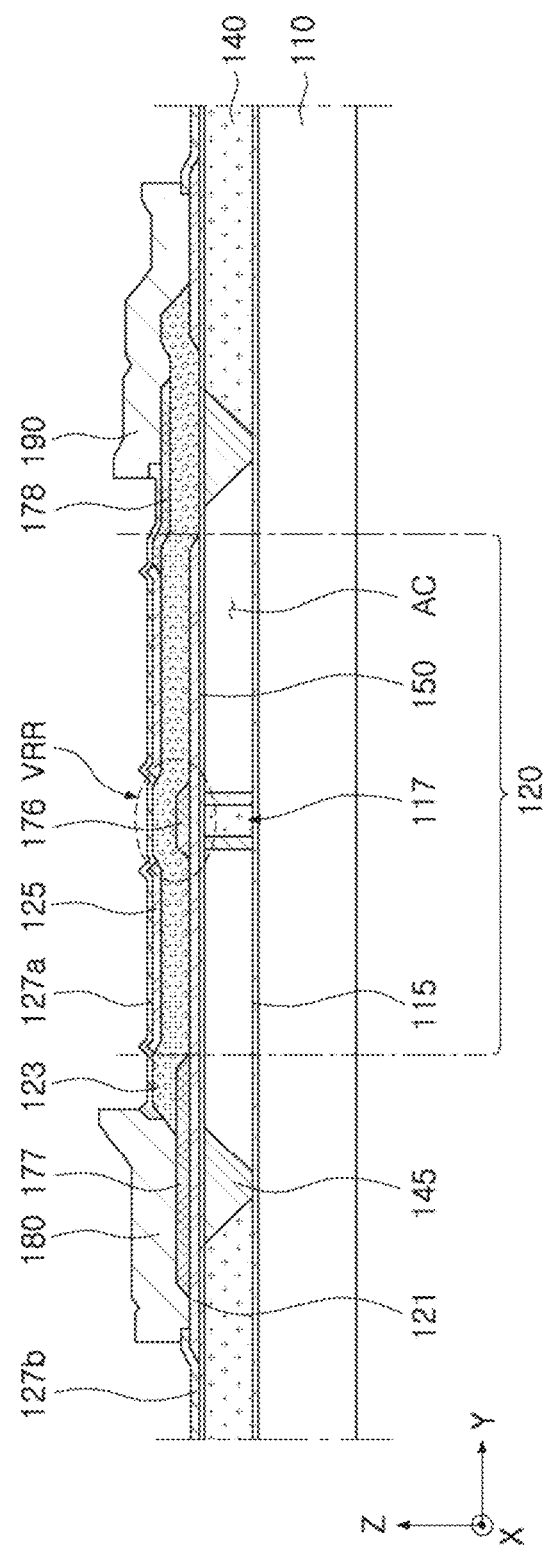
Figure 4D:
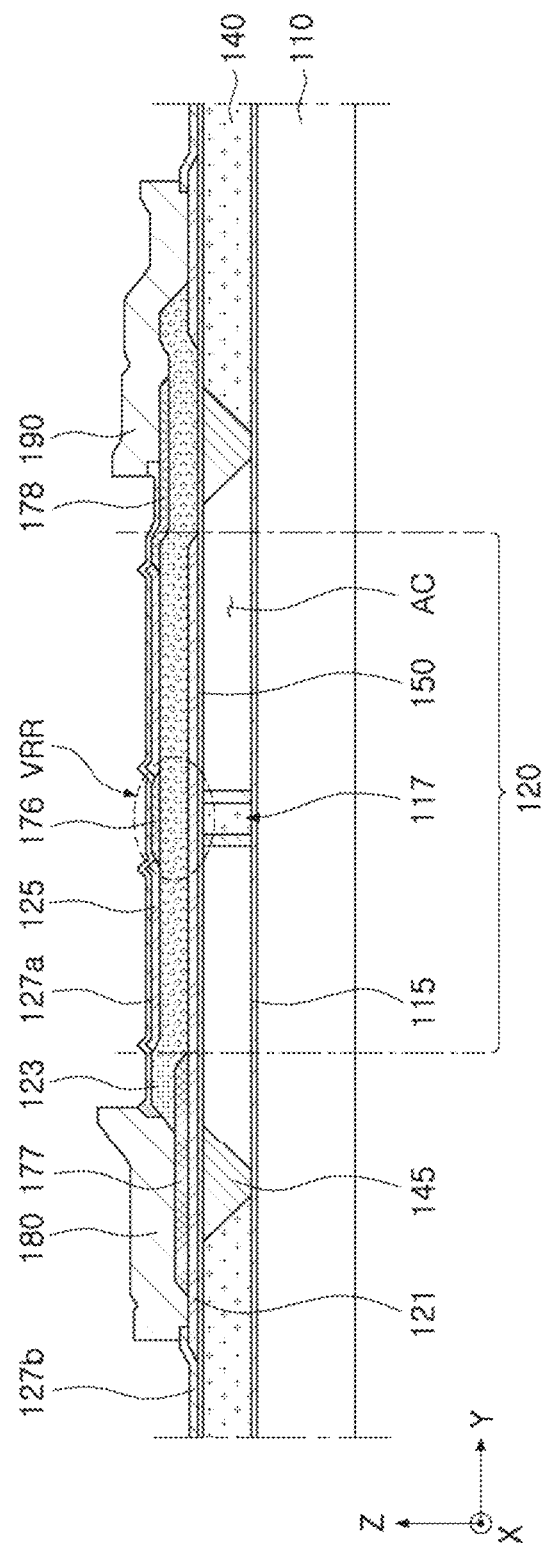
Figure 4E:
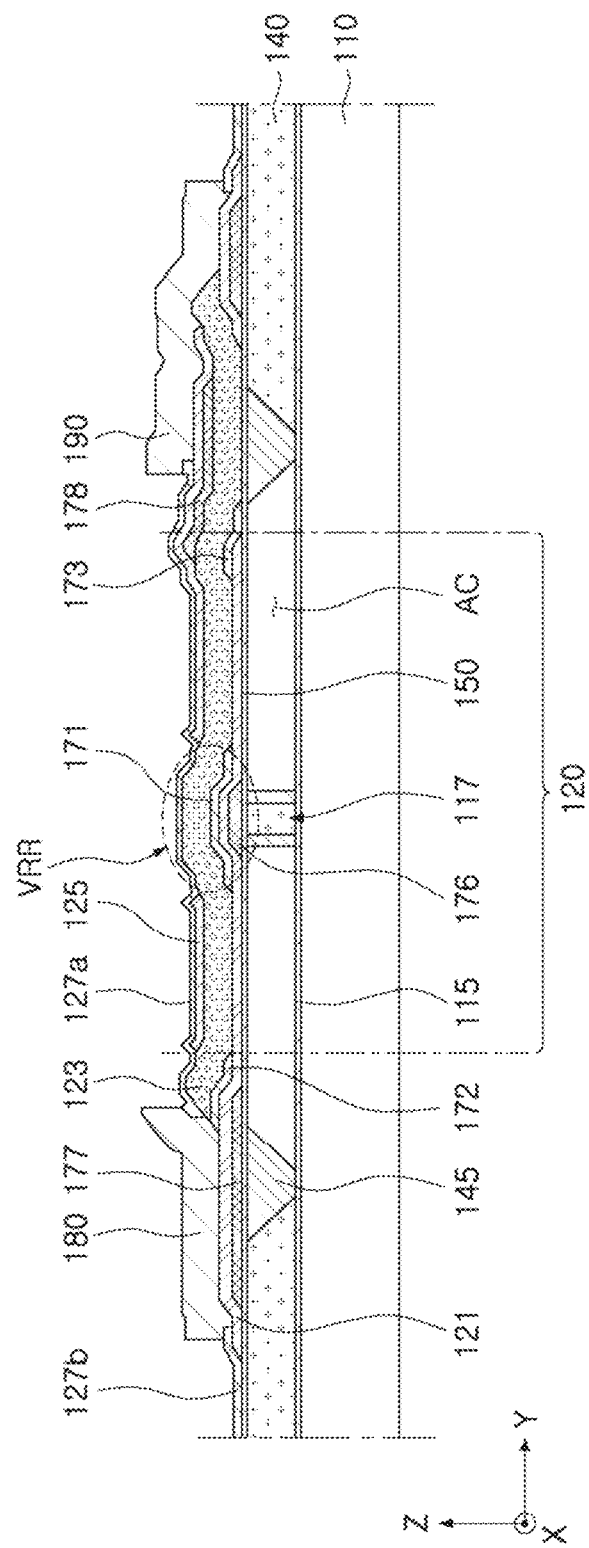

Referring to FIG. 4E, the first insertion layer 171 may be formed of an insulating material disposed between the first electrode 121 and the piezoelectric layer 123, and the first metal insertion layer 176 may be disposed between the first electrode 121 and the pillar 117.

The first insertion layer 171 may have a relatively low acoustic impedance compared to the first metal insertion layer 176, such that the vibrations of the resonating unit 120 may be effectively reflected more efficiently.

The first metal insertion layer 176 may have much higher thermal conductivity than that of the first insertion layer 171, such that the heat radiation efficiency of the pillar 117 may be improved.

A combined structure of the first insertion layer 171 made of an insulating material and the first metal insertion layer 176 may have high acoustic wave reflection characteristics while having high heat radiation efficiency.

FIGS. 5A to 5E are side views illustrating various structures of a frame included in an acoustic resonator, according to an embodiment.

Figure 5A:
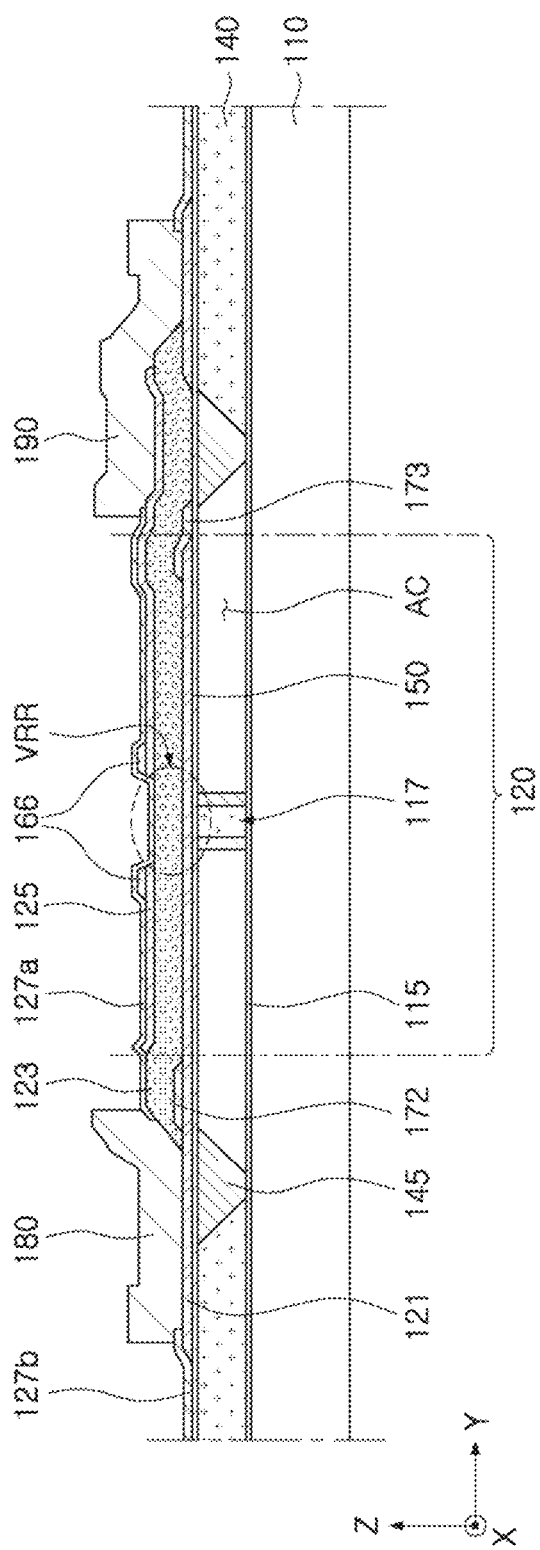
FIGS. 5A to 5E are side views illustrating various structures of frames included in an acoustic resonator, according to an embodiment.
Figure 5B:
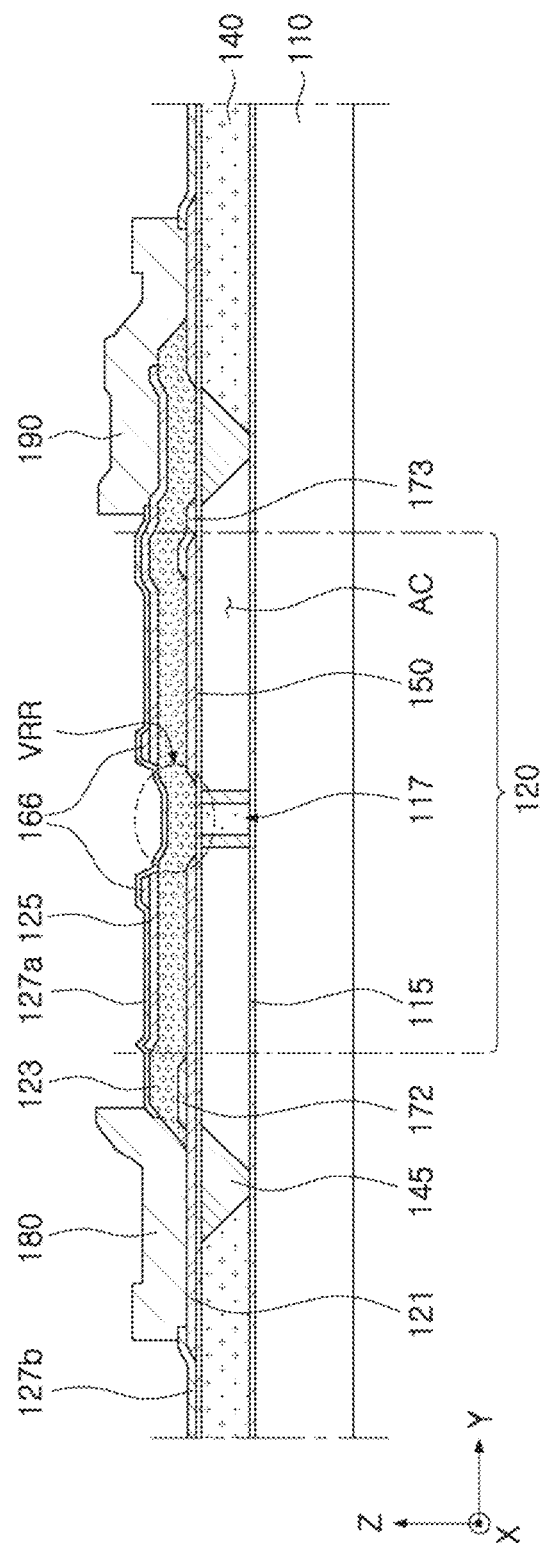

Referring to FIGS. 5A and 5B, the acoustic resonator may further include a first frame 166 disposed on an upper side of the second electrode 125 and disposed to surround the hole VRR.

The first frame 166 may act complementarily on the second insertion layers 172 and 173. The resonating unit 120 may have a bent shape on the upper side of the second insertion layers 172 and 173 according to the disposition of the second insertion layers 172 and 173. The first frame 166 may adaptively reflect the vibration of the resonating unit 120 to the bent shape of the resonating unit 120.

Accordingly, the acoustic resonator may further suppress the leakage of the vibration through the pillar 117.

Figure 5C:
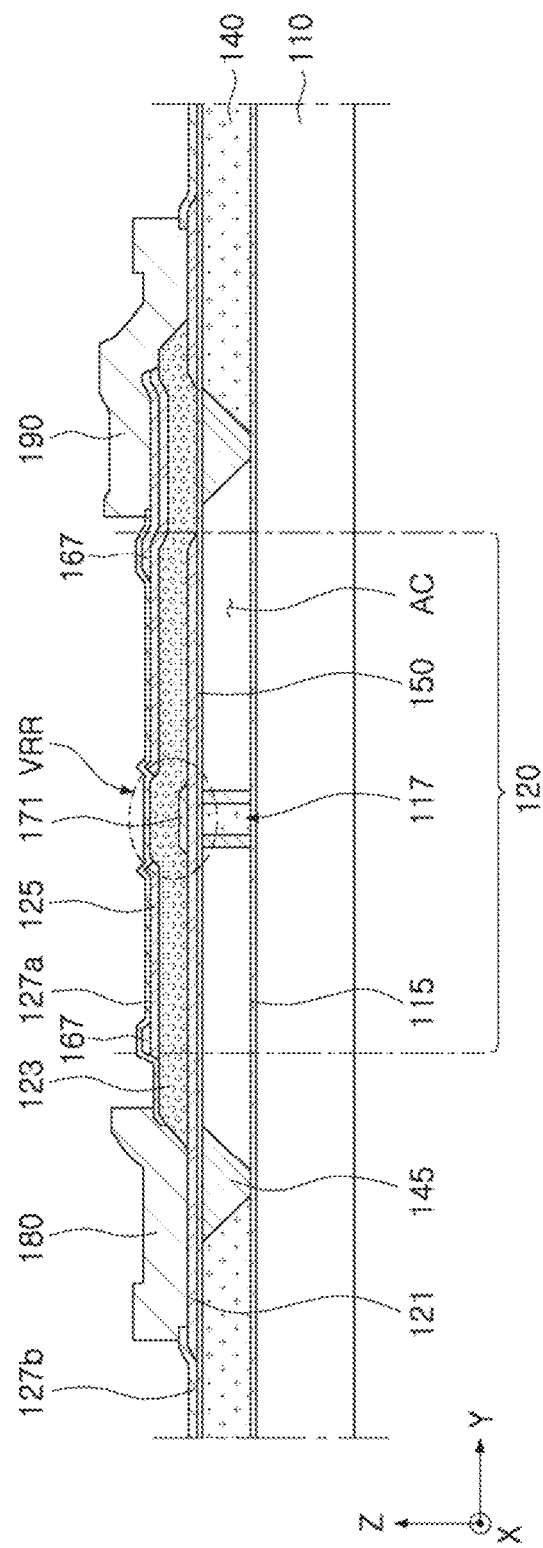
Figure 5D:
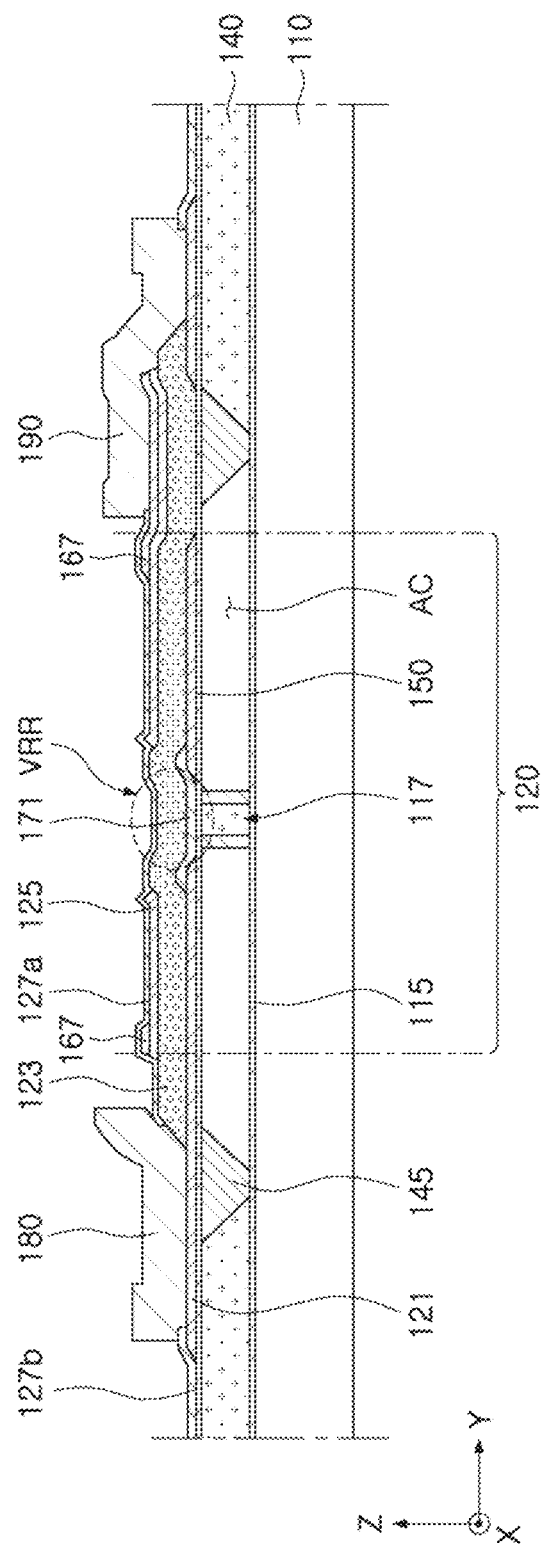

Referring to FIGS. 5C and 5D, the acoustic resonator may further include a second frame 167 disposed to surround the resonating unit 120 while surrounding the hole VRR. The second frame 167 may be disposed on an upper side of the second electrode 125.

The second frame 167 may complementarily act on the first insertion layer 171.

Figure 5E:
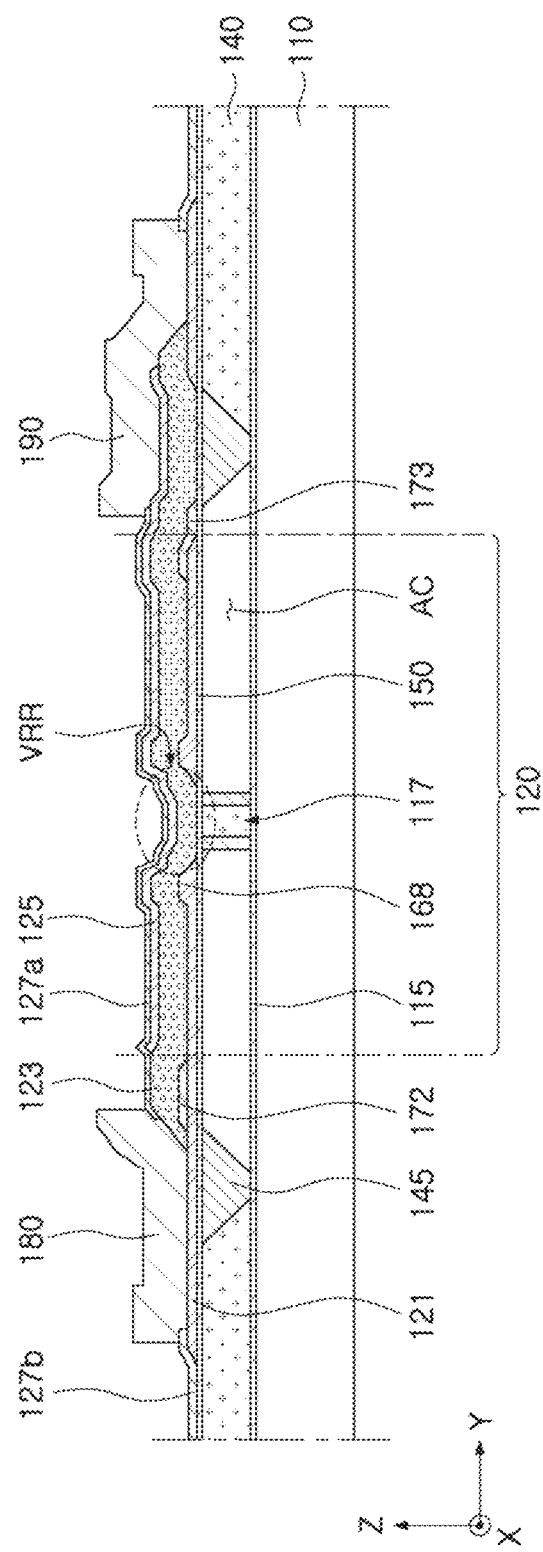

Referring to FIG. 5E, the acoustic resonator may further include a third frame 168 disposed on the upper side of the first electrode 121. The third frame 168 may be disposed lower than the above-described first and second frames 166 and 167, and may reflect the vibrations of the resonating unit 120 according to a principle similar to that of the first and second frames 166 and 167. The third frame 168 may be made of the same material as the first electrode 121, but is not limited to being made of the same material as the first electrode 121.

For example, the third frame 168 may be disposed to surround the hole VRR like the first frame 166, and may be disposed to surround the resonating unit 120 like the second frame 167, such that the size of a region surrounded by the third frame 168 is not particularly limited.

Referring to FIG. 1A to 5D, the acoustic resonator may further include a substrate 110, an insulating layer 115, protective layers 127a and 127b, a membrane layer 150, and first and second metal layers 180 and 190.

The substrate 110 may be a silicon substrate. For example, a silicon wafer may be used as the substrate 110. Alternatively, a silicon on insulator (SOI) type substrate may be used as the substrate 110.

The insulting layer 115 may be formed on an upper surface of the substrate 110, and the substrate 110 may be electrically isolated from the resonating unit 120. In addition, the insulating layer 115 may prevent the substrate 110 from being etched by an etching gas when the cavity AC is formed during a manufacturing process of the acoustic resonator.

In this case, the insulating layer 115 may be formed of any one or any combination of any two or more of silicon dioxide ($SiO_2$), silicon nitride ($Si_3N_4$), aluminum oxide ($Al_2O_3$) and aluminum nitride (AlN), and may be formed on the substrate 110 through any one or any combination of any two or more of thermal oxidation, chemical vapor deposition, RF magnetron sputtering, and evaporation.

The membrane layer 150 may be formed on the support unit 140 to define the thickness (or height) of the cavity AC together with the substrate 110. However, the disclosure is not limited to such a configuration, and the acoustic resonator may have a structure without the membrane layer 150.

The membrane layer 150 may be formed of a material which is not easily removed in the process of forming the cavity AC. For example, when a halide-based etching gas such as fluorine (F), chlorine (Cl), or the like is used to remove a portion of the support unit (for example, a cavity region), the membrane layer 150 may be formed of a material having low reactivity with the etching gas. In this case, the membrane layer 150 may include either one or both of silicon dioxide ($SiO_2$) and silicon nitride ($Si_3N_4$).

In addition, the membrane layer 150 may be formed of a dielectric layer containing any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), and may be formed of a metal layer containing any one or any combination of any two or more of aluminum (Al), nickel (Ni), chrome (Cr), platinum (Pt), gallium (Ga), and hafnium(Hf). However, the disclosure is not limited to the foregoing examples.

A seed layer made of aluminum nitride (AlN) may be formed on the membrane layer 150. Specifically, the seed layer may be disposed between the membrane layer 150 and the first electrode 121. In addition to AlN, the seed layer may further include a rare earth metal, a transition metal, or an alkaline earth metal in the case of a doped aluminum nitride, and may be formed using a dielectric material or metal having an HCP structure. In addition to AlN, the seed layer may further include a rare earth metal, a transition metal, or an alkaline earth metal in the case of a doped aluminum nitride, and may be formed using a dielectric material or metal having an HCP structure. For example, in the case of the seed layer being formed of a metal, the seed layer may be formed of titanium (Ti).

Protective layers 127a and 127b may be disposed along the surface of the acoustic resonator (for example, the upper surface of the second electrode or the upper surface of the piezoelectric layer) to protect the acoustic resonator from the outside. Further, portions of the protective layers 127a and 127b may be removed by etching for frequency adjustment in a final process. That is, thicknesses of the protective layers 127a and 127b may be freely adjusted according to design parameters.

The protective layer 127 may be formed of any one insulating material of a silicon oxide series material, a silicon nitride series material, an aluminum oxide series material, and an aluminum nitride series material.

First and second metal layers 180 and 190 may be disposed on the upper side of the first and second electrodes 121 and 125, respectively, may be electrically connected to the first and second electrodes 121 and 125, and may act as an external connection terminal to an adjacent acoustic resonator or an input/output port.

The first and second metal layers 180 and 190 may be formed of a material having a resistivity that is lower than that of the first and second electrodes 121 and 125, and the first and second metal layers 180 and 190 may be thicker than the first and second electrodes 121 and 125 to have a low resistance value. Accordingly, the insertion loss of the acoustic resonator may be reduced.

For example, the first and second metal layers 180 and 190 may be formed of gold (Au), a gold-tin (Au—Sn) alloy, copper (Cu), a copper-tin (Cu—Sn) alloy, aluminum (Al), an aluminum-germanium (Al—Ge) alloy, or the like.

FIGS. 6A to 6E are side views illustrating a manufacturing method of an acoustic resonator, according to an embodiment.

Figure 6A:
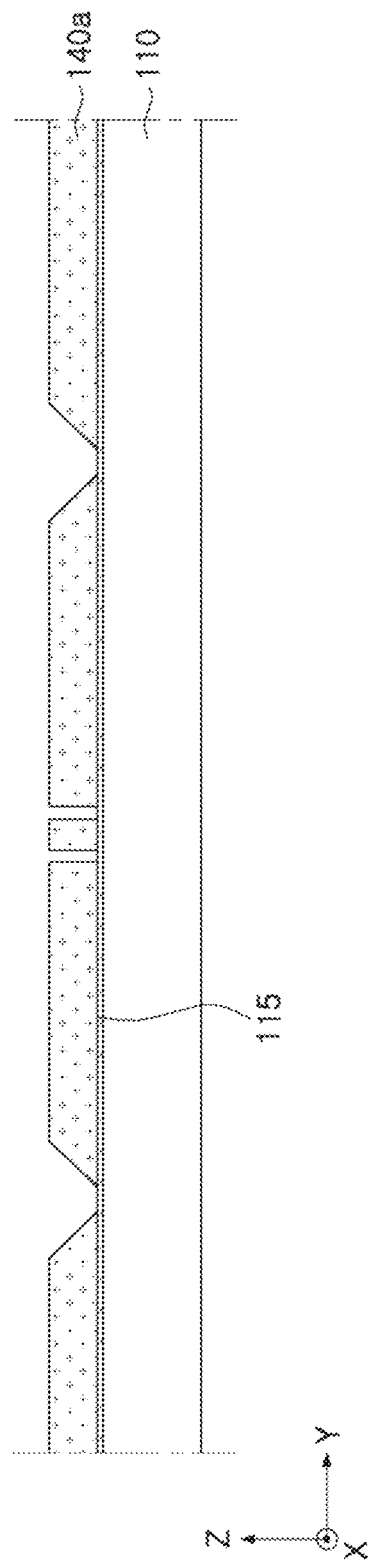
FIGS. 6A to 6E are side views illustrating a manufacturing method of an acoustic resonator, according to an embodiment.

Referring to FIG. 6A, the insulating layer 115 may be formed on the substrate 110, and a support unit 140a may be formed on the insulating layer 115. Thereafter, a pattern corresponding to the cavity AC and the pillar 117 may be formed in the support unit 140a.

The support unit 140a may be formed of a material such as polysilicon, polymer, or the like, which easy to etch, but is not limited to these examples.

Figure 6B:
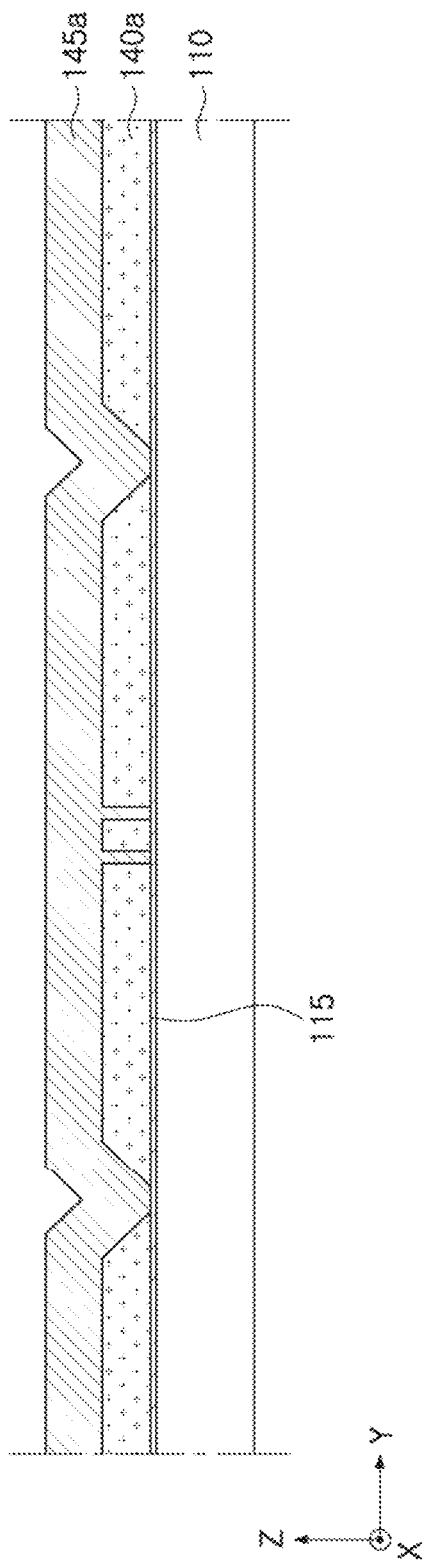

Referring to FIG. 6B, an etch stop layer 145a may be deposited on the support unit 140a. The etch stop layer 145a may be formed of the same material as the insulating layer 115, but is not limited to being formed of the same material as the insulating layer 115.

Figure 6C:
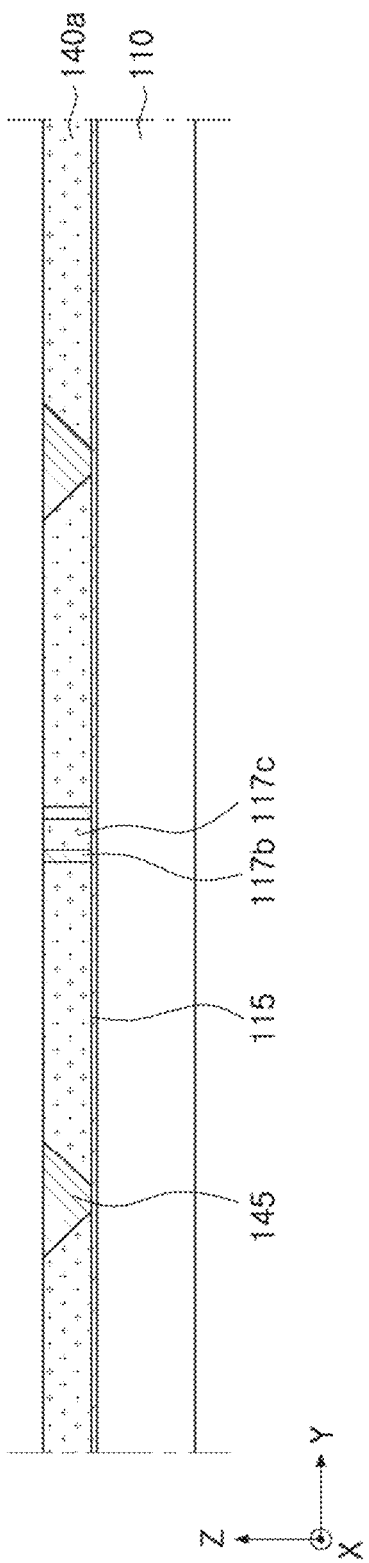

Referring to FIG. 6C, the etch stop layer 145, a second etch stop layer 117b, and a thermally conductive layer 117c may be formed by planarizing the etch stop layer 145a. Accordingly, the pillar 117 is formed by the second etch stop layer 117b and the thermally conductive layer 117c.

Figure 6D:
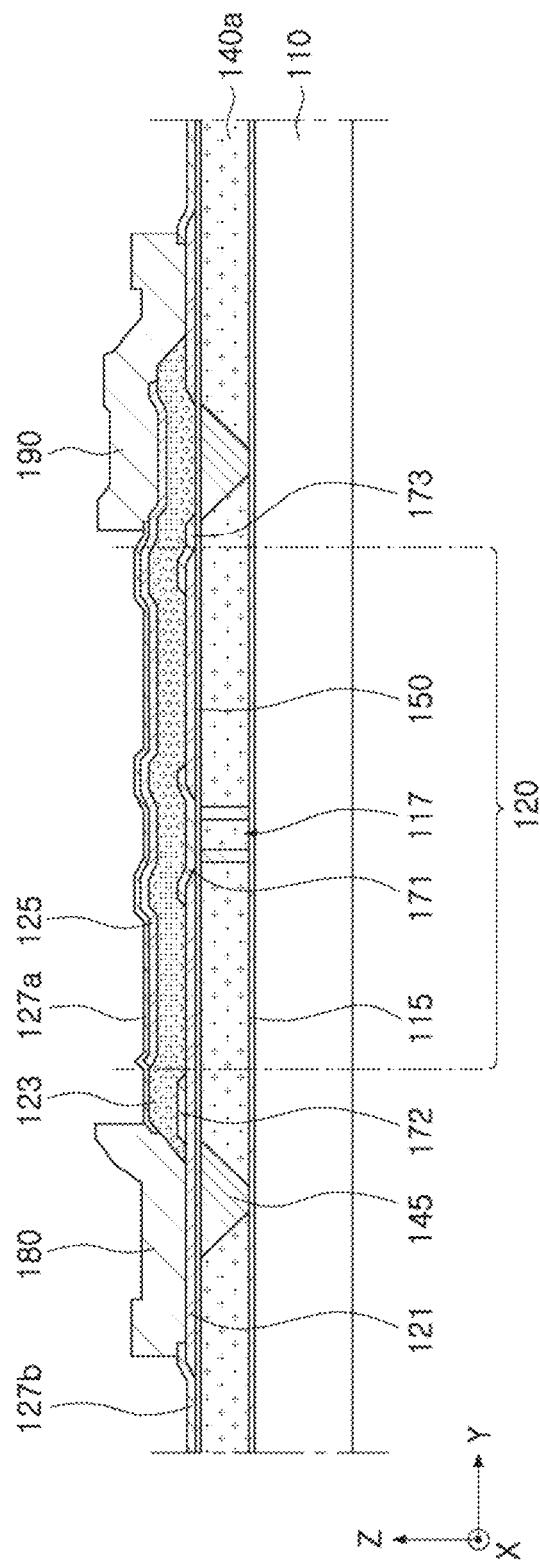

Referring to FIG. 6D, the membrane layer 150, the first electrode 121, the first insertion layer 171 and second insertion layers 172 and 173, the piezoelectric layer 123, the second electrode 125, the protective layer 127, and the first and second metal layers 180 and 190 may be sequentially formed.

Figure 6E:
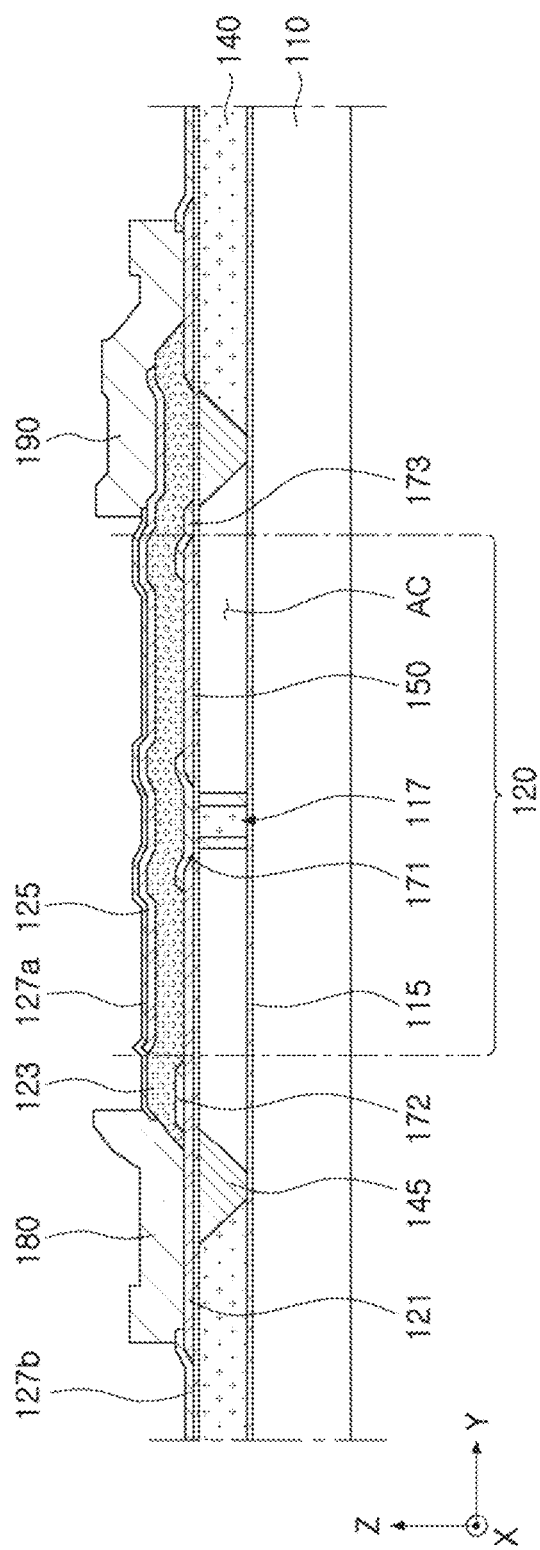

Referring to FIG. 6E, the cavity AC may be formed in accordance with removal (for example: etching) of a portion of the support unit 140a located inside the etch stop layer 145. When the support unit 140a is formed of a material such as polysilicon, polymer, or the like, the portion of the support unit 140a may be removed by a dry etching method using a halide-based etching gas such as fluorine (F), chlorine (Cl), or the like (for example, $XeF_2$). As a result of removing the portion of the support unit 140a, the support unit 140 is formed.

Then, a process of further etching the thickness of the protective layer may be performed to obtain a desired frequency characteristic.

Figure 7A:
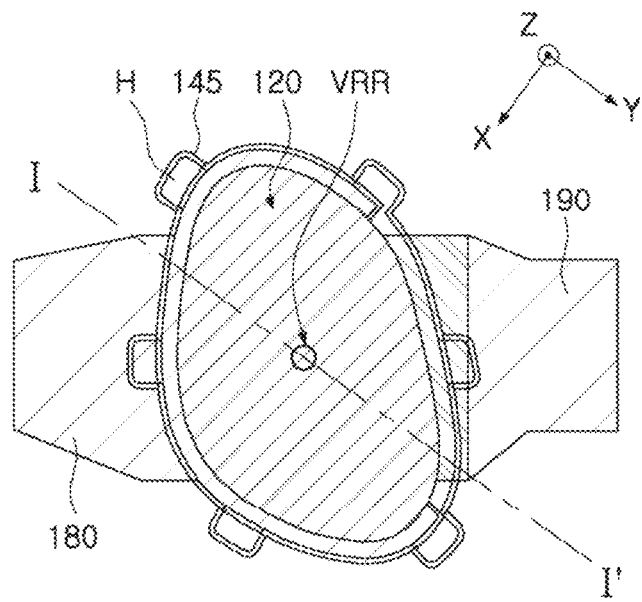
FIGS. 7A to 7C are plan views illustrating an acoustic resonator, according to an embodiment of the present disclosure.
Figure 7B:
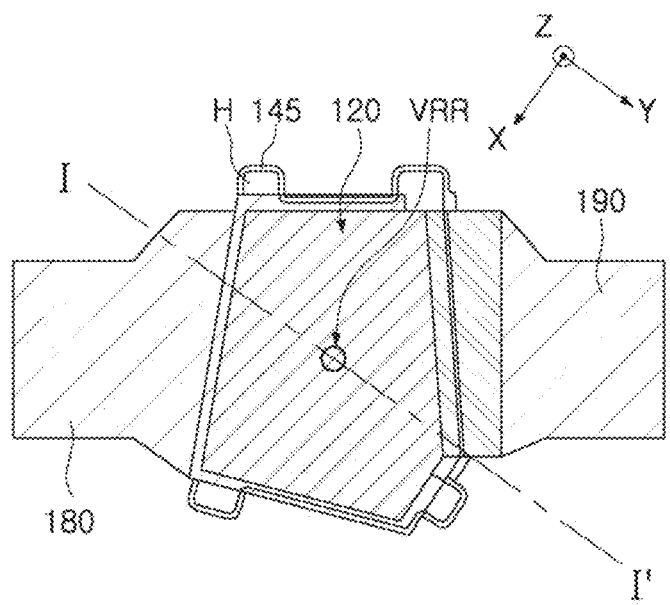
Figure 7C:
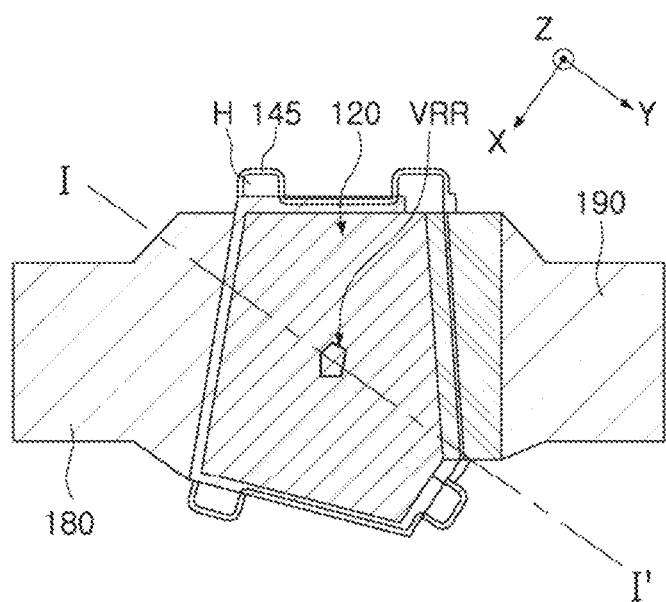

FIGS. 7A to 7C are plan views illustrating an acoustic resonator, according to an embodiment.

Referring to FIGS. 7A to 7C, a resonating unit 120 may be circular, irregular elliptical, polygonal, or irregular polygonal, and the hole VRR may be circular, irregularly elliptical, polygonal, or irregularly polygonal, and may be disposed in the center of the resonating unit 120.

The acoustic resonators illustrated in FIGS. 1A to 6E show a cross-section between I and I', illustrated in FIGS. 7A to 7C.

An inlet hole H illustrated in FIGS. 7A to 7C may act as an inflow path of an etching gas of an etching solution, and may be utilized in forming the above-described cavity AC.

Figure 8A:
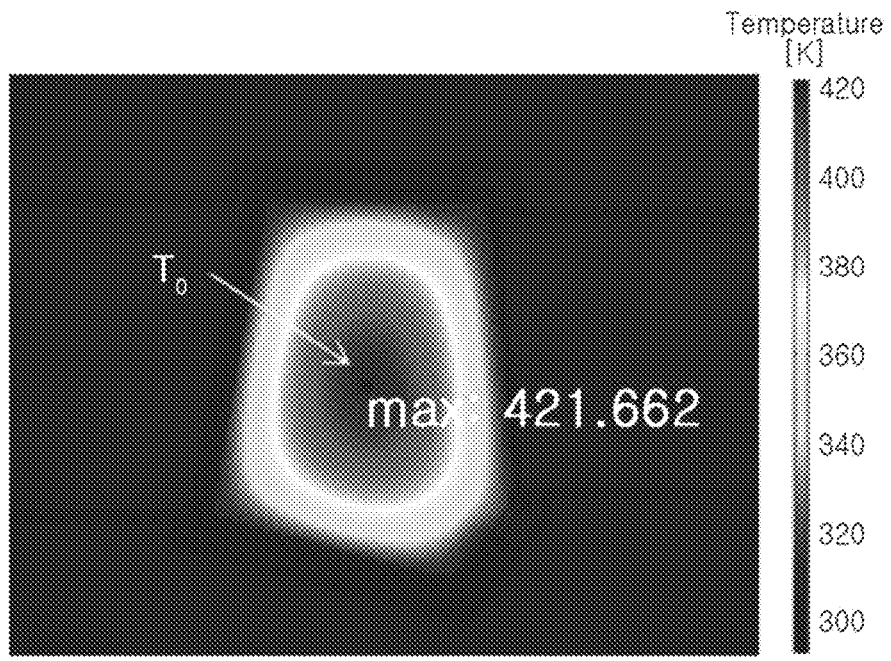
FIGS. 8A to 8C are plan views illustrating temperature distributions of an acoustic resonator, according to an embodiment.
Figure 8B:
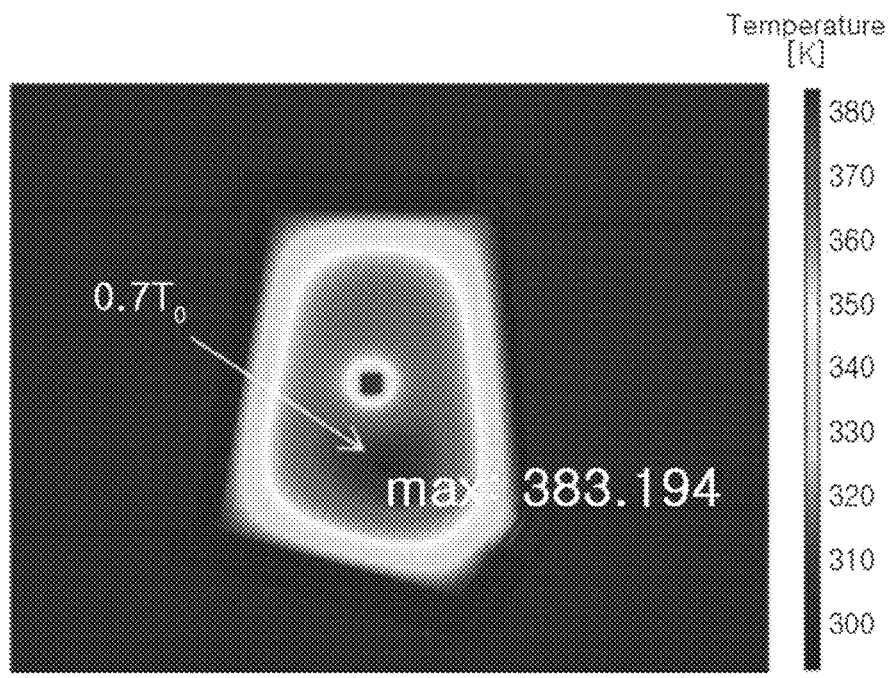
Figure 8C:
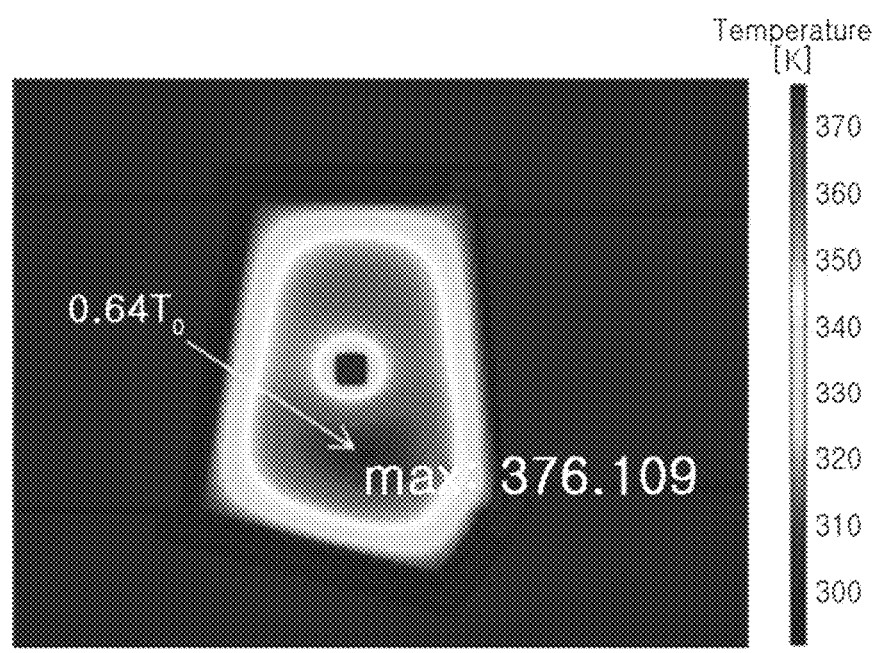

FIG. 8A is a plan view illustrating a temperature distribution of an acoustic resonator in which a pillar (e.g., the pillar 117 in FIGS. 1A-1D) is omitted, and FIGS. 8B and 8C are plan views illustrating a temperature distribution of an acoustic resonator according to an embodiment.

Referring to FIG. 8A, a temperature at a point having the highest temperature in the resonating unit of the acoustic resonator in which the pillar is omitted was $T_0$ (for example: 421.662 K).

Referring to FIGS. 8B and 8C, a temperature of a portion corresponding to the point having the highest temperature in the resonating unit of FIG. 8A was lowered by the pillar.

Referring to FIG. 8B, in an example in which a radius of an upper surface of the pillar was 3 μm, the temperature at the point having the highest temperature in the resonating unit of the acoustic resonator was about 0.7 times(based on Celsius) of $T_0$ (for example: 421.662 K).

Referring to FIG. 8C, in an example in which a radius of an upper surface of the pillar was 5 μm, a temperature at a point having the highest temperature in the resonating unit of the acoustic resonator was about 0.64 times of $T_0$ (based on Celsius).

For example, the pillar may be disposed at a point having the highest temperature in the acoustic resonator in which the pillar is omitted, but a specific position of the pillar may be adaptively shifted to match a maximum temperature point moving according to the disposition of the pillar, and may be optimized depending on the shape of the acoustic resonator and the external environment.

As set forth above, an acoustic resonator disclosed herein is capable of reducing vibration leakage while ensuring heat radiation performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator, comprising:
   a resonating unit comprising
      a piezoelectric layer,
      a first electrode disposed on a lower side of the piezoelectric layer, and
      a second electrode disposed on an upper side of the piezoelectric layer;
   a substrate disposed below the resonating unit;
   a support unit forming a cavity between the substrate and the resonating unit; and
   a pillar extending through the cavity and connecting the resonating unit to the substrate,
   wherein the resonating unit further comprises a first insertion layer disposed above the pillar.

2. The acoustic resonator of claim 1, further comprising a first etch stop layer disposed between the support unit and the cavity.

3. The acoustic resonator of claim 1, wherein the pillar comprises:
   a second etch stop layer disposed in the cavity and disposed between the resonating unit and the substrate; and
   a thermally conductive layer surrounded by the second etch stop layer and formed of a material different from a material of the second etch stop layer.

4. The acoustic resonator of claim 1, wherein a hole is located above the pillar and is disposed in either one or both of the first electrode and the second electrode.

5. The acoustic resonator of claim 4, further comprising:
   a frame disposed on an upper side of the first electrode or an upper side of the second electrode, and disposed to surround the hole; and
   a second insertion layer disposed further outwardly from the pillar in a horizontal direction than the first insertion layer.

6. The acoustic resonator of claim 4, wherein the first insertion layer is disposed to cover the hole.

7. The acoustic resonator of claim 1, further comprising a frame disposed on an upper side of the first electrode or an upper side of the second electrode, and surrounding at least a portion of the resonating unit.

8. The acoustic resonator of claim 1, wherein the resonating unit further comprises a second insertion layer disposed further outwardly from the pillar in the horizontal direction than the first insertion layer.

9. The acoustic resonator of claim 1, wherein the first insertion layer comprises a metal insertion layer.

10. The acoustic resonator of claim 9, wherein the first insertion layer further comprises an insulating insertion layer disposed between the first electrode and the piezoelectric layer, and
wherein the metal insertion layer is disposed between the first electrode and the pillar.

11. The acoustic resonator of claim 10, wherein the resonating unit further comprises:
a second insertion layer disposed further outwardly from the pillar in the horizontal direction than the first insertion layer, the second insertion layer including a metal and being electrically connected to the first or second electrode; and
a metal layer electrically connected to the second insertion layer, the metal layer being disposed on the upper side of the first or second electrode, and being formed of a material different from a material of the first or second electrode.

12. The acoustic resonator of claim 1, wherein a width of an upper surface of the pillar is less than a width of the first insertion layer, and a width of a lower surface of the pillar is greater than the width of the first insertion layer.

13. The acoustic resonator of claim 1, further comprising:
a membrane layer disposed between the resonating unit and the pillar; and
an insulating layer disposed between the pillar and the substrate.

14. An acoustic resonator, comprising:
a resonating unit comprising
a piezoelectric layer,
a first electrode disposed on a lower side of the piezoelectric layer, and
a second electrode disposed on an upper side of the piezoelectric layer;
a substrate disposed below the resonating unit;
a support unit forming a cavity between the substrate and the resonating unit;
a first etch stop layer disposed between the support unit and the cavity; and
a pillar comprising
a second etch stop layer disposed in the cavity and disposed between the resonating unit and the substrate, and
a thermally conductive layer surrounded by the second etch stop layer and formed of a material different from a material of the second etch stop layer,
wherein a hole is located above the pillar and is disposed in either one or both of the first electrode and the second electrode.

15. The acoustic resonator of claim 14, wherein the thermally conductive layer has a thermal conductivity higher than a thermal conductivity of the second etch stop layer.

16. The acoustic resonator of claim 14, wherein a width of a lower surface of the pillar is greater than a width of an upper surface of the pillar.

17. The acoustic resonator of claim 14, further comprising a first frame disposed on an upper side of the first electrode or an upper side of the second electrode, and disposed to surround the hole.

18. The acoustic resonator of claim 17, further comprising an insertion layer disposed outside of the resonating unit in a horizontal direction.

19. The acoustic resonator of claim 18, wherein the insertion layer is disposed between the first electrode and the piezoelectric layer.

* * * * *